(12) United States Patent
Denison et al.

(10) Patent No.: US 7,893,499 B2
(45) Date of Patent: Feb. 22, 2011

(54) MOS TRANSISTOR WITH GATE TRENCH ADJACENT TO DRAIN EXTENSION FIELD INSULATION

(75) Inventors: Marie Denison, Plano, TX (US);
Sameer Pendharkar, Allen, TX (US);
Binghua Hu, Plano, TX (US); Taylor Rice Efland, Richardson, TX (US);
Sridhar Seetharaman, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 63 days.

(21) Appl. No.: 12/417,810

(22) Filed: Apr. 3, 2009

(65) Prior Publication Data
US 2010/0252882 A1    Oct. 7, 2010

Related U.S. Application Data

(60) Provisional application No. 61/042,380, filed on Apr. 4, 2008.

(51) Int. Cl.
*H01L 29/66* (2006.01)

(52) U.S. Cl. ..................... 257/367; 257/288; 257/365; 257/366

(58) Field of Classification Search .................. 257/367, 257/299, 365, 366
See application file for complete search history.

(56) References Cited

U.S. PATENT DOCUMENTS

| | | | |
|---|---|---|---|
| 2008/0054325 A1* | 3/2008 | Takahashi et al. | 257/299 |
| 2009/0140343 A1* | 6/2009 | Feilchenfeld et al. | 257/367 |
| 2009/0179272 A1* | 7/2009 | Campi et al. | 257/365 |

* cited by examiner

*Primary Examiner*—Thanh V Pham
*Assistant Examiner*—Errol Fernandes
(74) *Attorney, Agent, or Firm*—Jacqueline J. Garner; Wade J. Brady, III; Frederick J. Telecky, Jr.

(57) ABSTRACT

An integrated circuit containing an MOS transistor with a trenched gate abutting an isolation dielectric layer over a drift region. The body well and source diffused region overlap the bottom surface of the gate trench. An integrated circuit containing an MOS transistor with a first trenched gate abutting an isolation dielectric layer over a drift region, and a second trenched gate located over a heavily doped buried layer. The buried layer is the same conductivity type as the drift region. A process of forming an integrated circuit containing an MOS transistor, which includes an isolation dielectric layer over a drift region of a drain of the transistor, and a gate formed in a gate trench which abuts the isolation dielectric layer. The gate trench is formed by removing substrate material adjacent to the isolation dielectric layer.

6 Claims, 24 Drawing Sheets

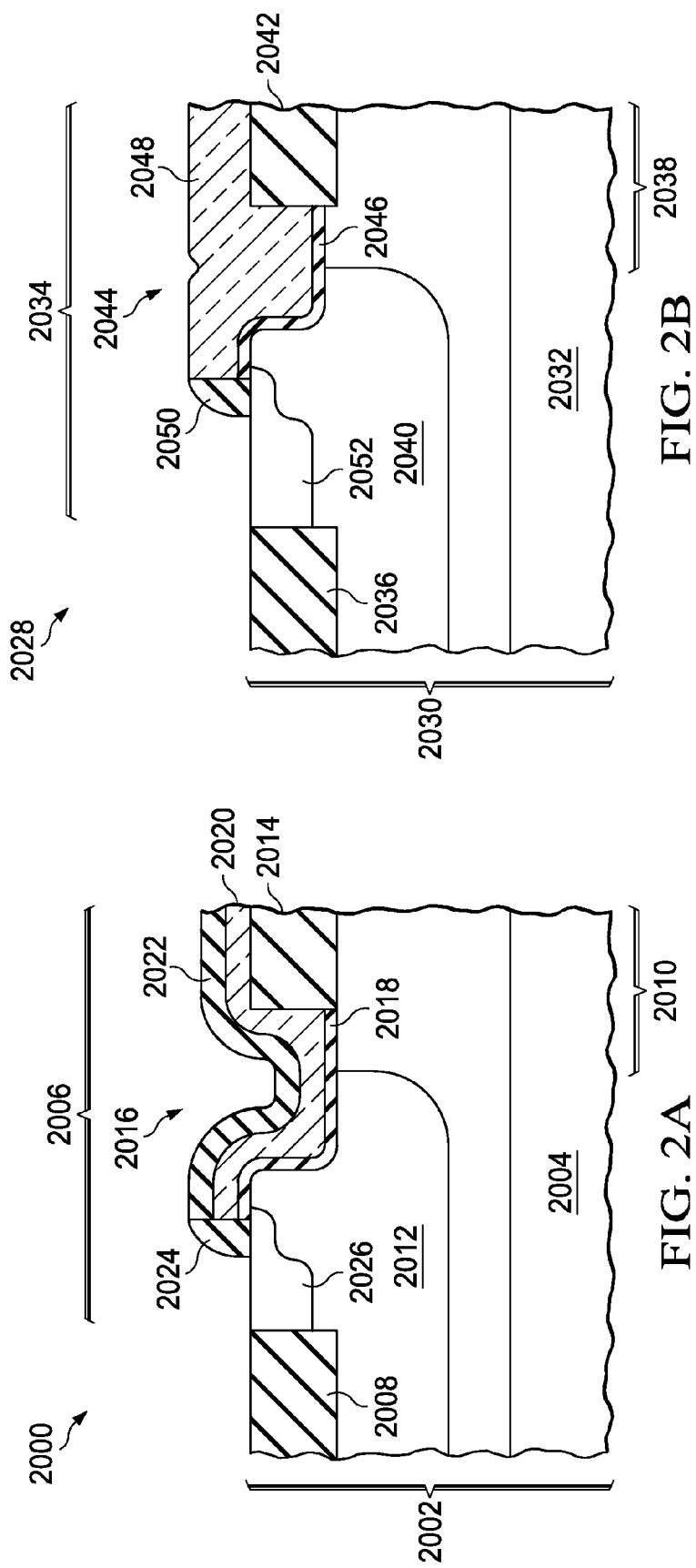

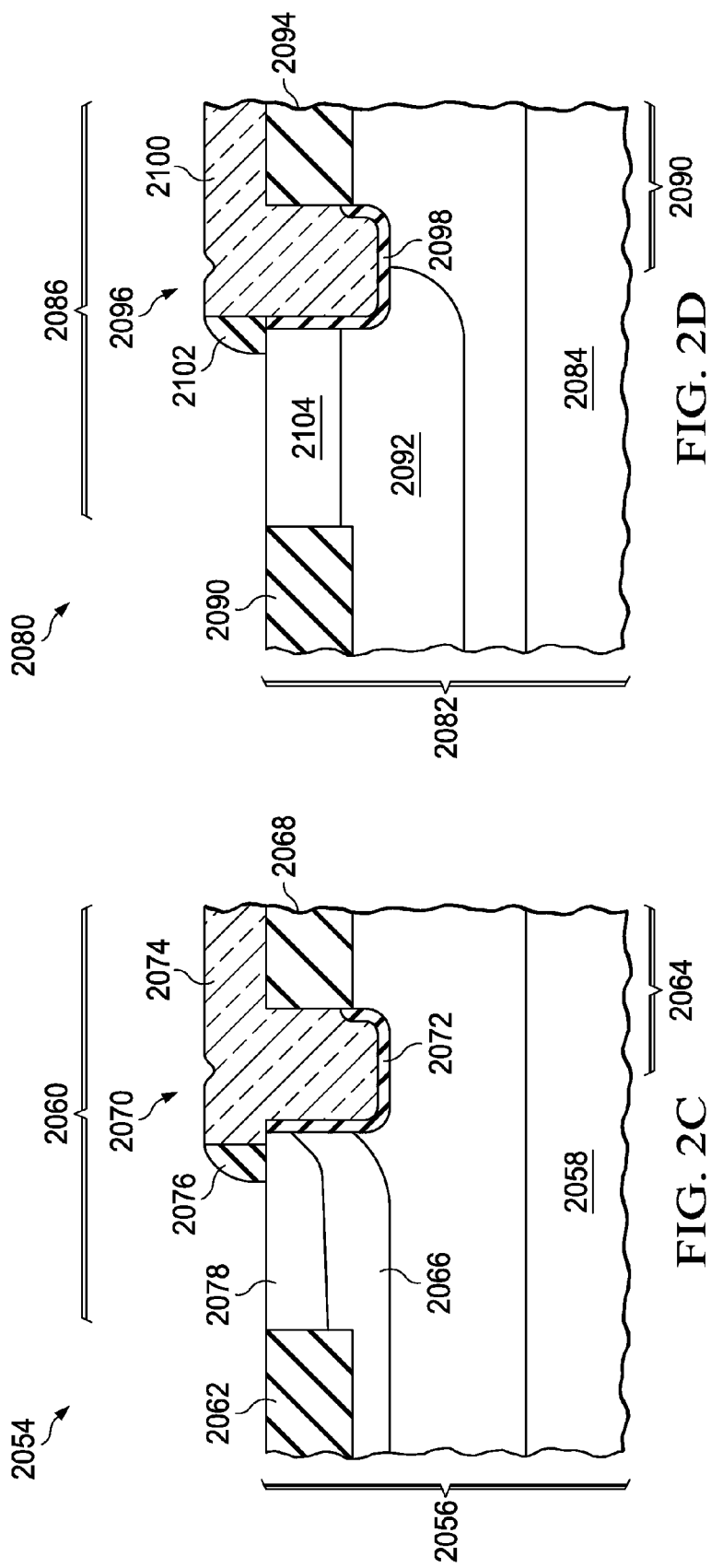

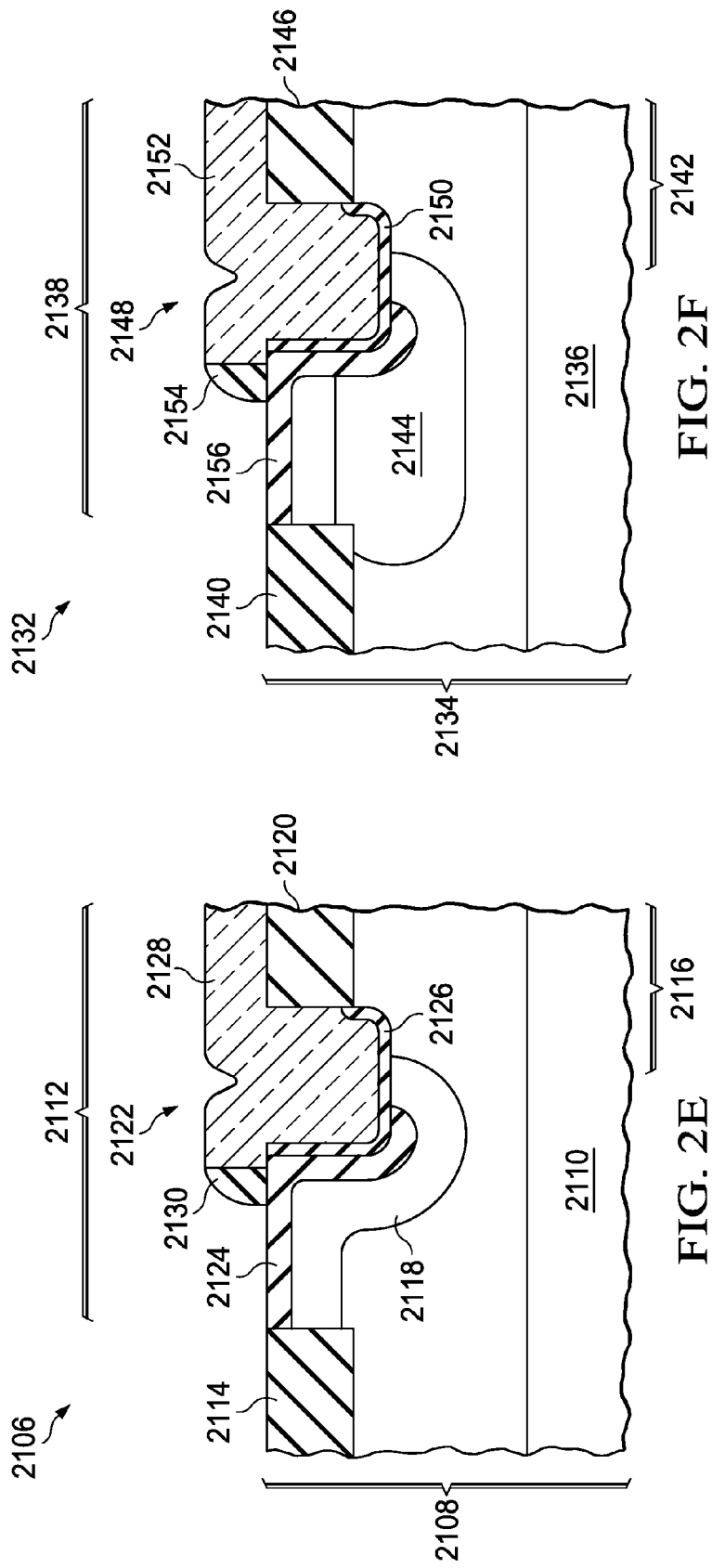

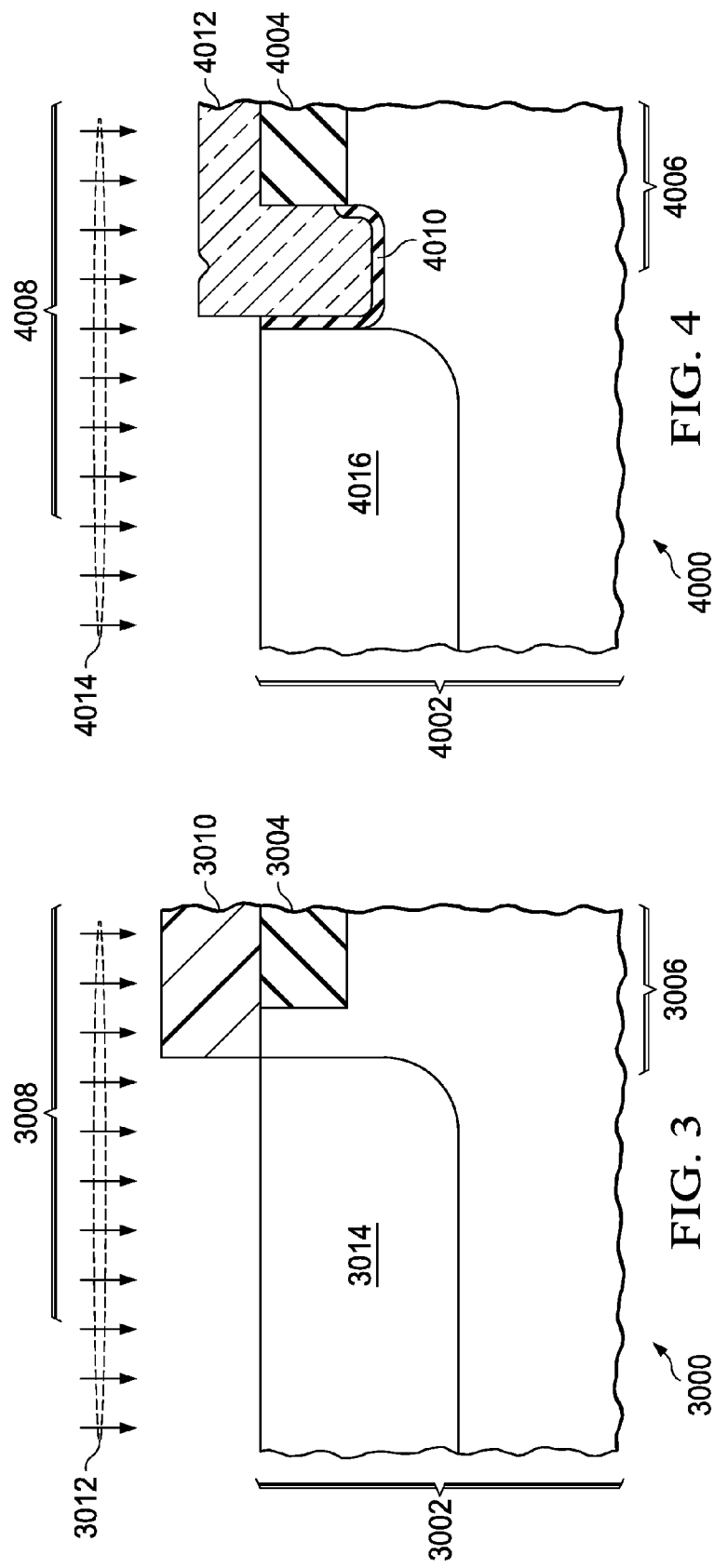

MOS TRANSISTOR WITH GATE TRENCH ADJACENT TO DRAIN EXTENSION FIELD INSULATION

CROSS-REFERENCE TO RELATED APPLICATIONS

The following co-pending patent application is related and hereby incorporated by reference: U.S. Patent Provisional Application 12/101,762, filed Apr. 11, 2008.

FIELD OF THE INVENTION

This invention relates to the field of integrated circuits. More particularly, this invention relates to drain extended MOS (DEMOS) transistors and laterally diffused MOS (LDMOS) transistors in integrated circuits.

BACKGROUND OF THE INVENTION

It may be desirable to increase on-state current densities in drain extended MOS (DEMOS) transistors and laterally diffused MOS (LDMOS) transistors in integrated circuits, without sacrificing such parameters as breakdown voltage, hot carrier injection and safe operating area. In particular, it may be desirable to reduce electrical resistance associated with confined semiconductor regions between isolation dielectric layers and source regions in DEMOS and LDMOS transistors.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an MOS transistor is provided in which the transistor includes a gate formed in a gate trench abutting an isolation dielectric layer over a drift region. A body well overlaps a portion of the bottom surface of the gate trench, and a source diffused region overlaps a portion of the bottom gate trench surface within the body well overlap.

An integrated circuit containing an MOS transistor is provided in which the transistor includes a gate formed in a first gate trench abutting an isolation dielectric layer over a drift region, and in a second gate trench opposite the isolation dielectric layer and located over a heavily doped buried layer. The buried layer is the same conductivity type as the drift region.

A process of forming an integrated circuit containing an MOS transistor is provided, which includes an isolation dielectric layer over a drift region of a drain of the transistor, and a gate formed in a gate trench which abuts the isolation dielectric layer. The gate trench is formed by removing substrate material adjacent to the isolation dielectric layer.

DESCRIPTION OF THE VIEWS OF THE DRAWING

FIG. 2A through FIG. 2G are cross-sections of integrated circuits containing transistors formed according to embodiments of the instant invention, with different configurations of gate and source regions.

FIG. 3 and FIG. 4 are cross-sections of integrated circuits containing transistors formed according to embodiments of the instant invention, in which body wells are formed prior to and after, respectively, formation of gates of the transistors.

DETAILED DESCRIPTION

Figure 1A:
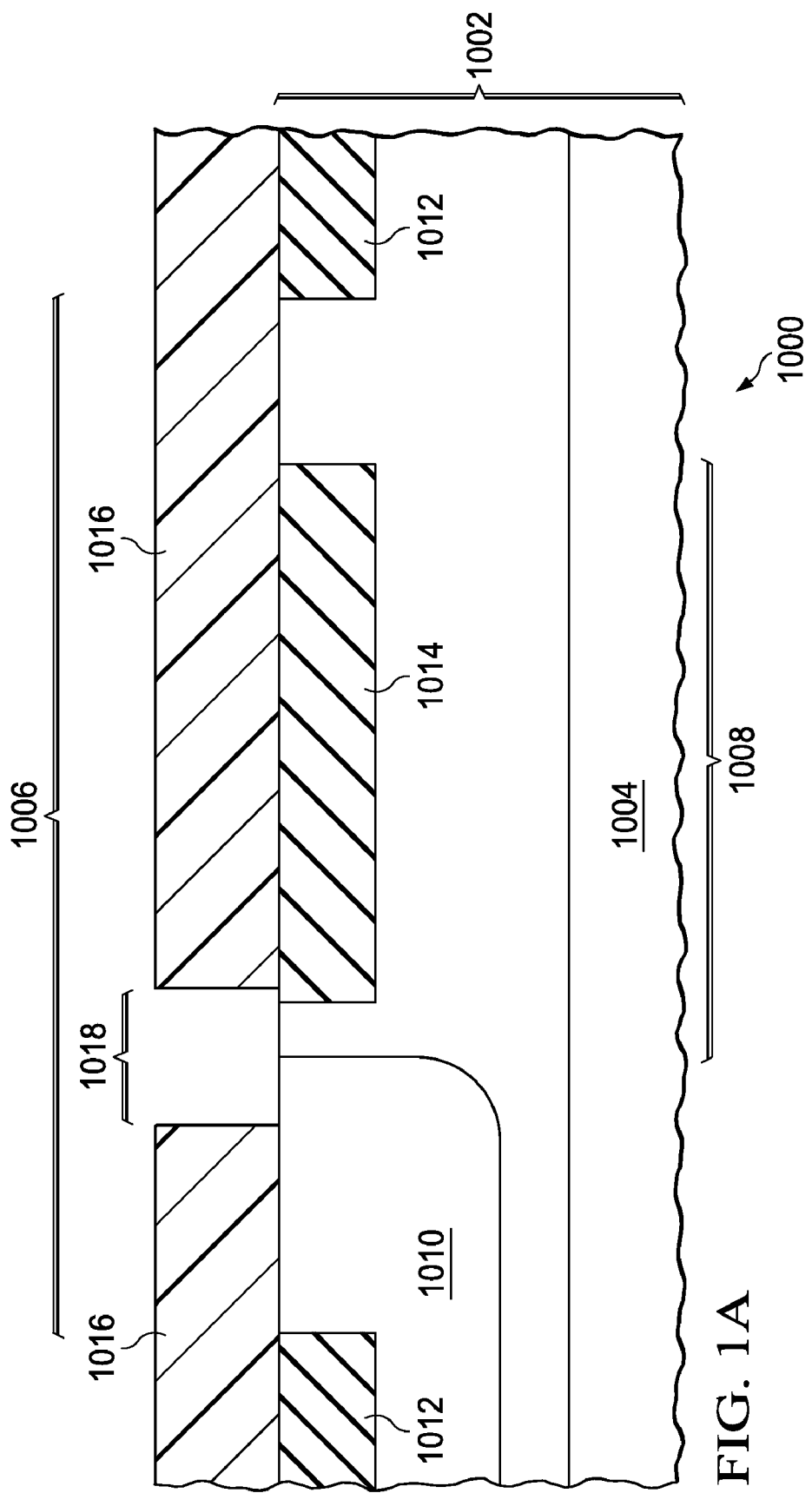
FIG. 1A through FIG. 1H are cross-sections of an integrated circuit containing a transistor formed according to an embodiment of the instant invention, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1A through FIG. 1H are cross-sections of an integrated circuit containing a transistor formed according to an embodiment of the instant invention, depicted in successive stages of fabrication. The transistor may be a DEMOS or LDMOS transistor. Referring to FIG. 1A, the integrated circuit (1000) is formed in and on a substrate (1002) which is commonly a single crystal silicon wafer, but may be a silicon-on-insulator (SOI) wafer, a hybrid orientation technology (HOT) wafer with regions of different crystal orientations, or other material appropriate for fabrication of the IC (1000). An optional heavily doped buried layer (1004) may be formed in the substrate (1002) under an area designated for the transistor (1006), for example by ion implanting dopants into the substrate (1002) followed by epitaxial semiconductor film growth on an existing top surface of the substrate (1002). The optional heavily doped buried layer (1004), if formed, has a same conductivity type as source and drain regions of the transistor (1006). A drift region (1008) is formed in the substrate (1002) between the source and drain regions. The drift region (1008) has a same conductivity type as the source and drain regions. The drift region (1008) is formed above the optional heavily doped buried layer (1004), if formed. A body well (1010) is formed in the substrate (1002) under a channel area of the transistor (1006). The body well may be formed by ion implanting dopants into the substrate (1002). A conductivity type of the body well (1010) is opposite the conductivity type of the source and drain regions. Optional elements of field oxide (1012) may be formed at a top surface of the substrate (1002) to isolate the transistor (1006) from other components (not shown) in the integrated circuit (1000).

A layer of isolation dielectric (1014) is formed at the top surface of the substrate (1002) over the drift region (1008). The isolation dielectric layer (1014) may be formed concurrently with field oxide elements in the integrated circuit (1000) or may be formed by other process steps. In one embodiment, the isolation dielectric layer (1014) is between 200 and 500 nanometers thick.

A gate trench photoresist pattern (1016) is formed on the top surface of the integrated circuit (1000) to define a gate trench area (1018) adjacent to, and possibly overlapping a portion of, the isolation dielectric layer (1014).

Figure 1B:
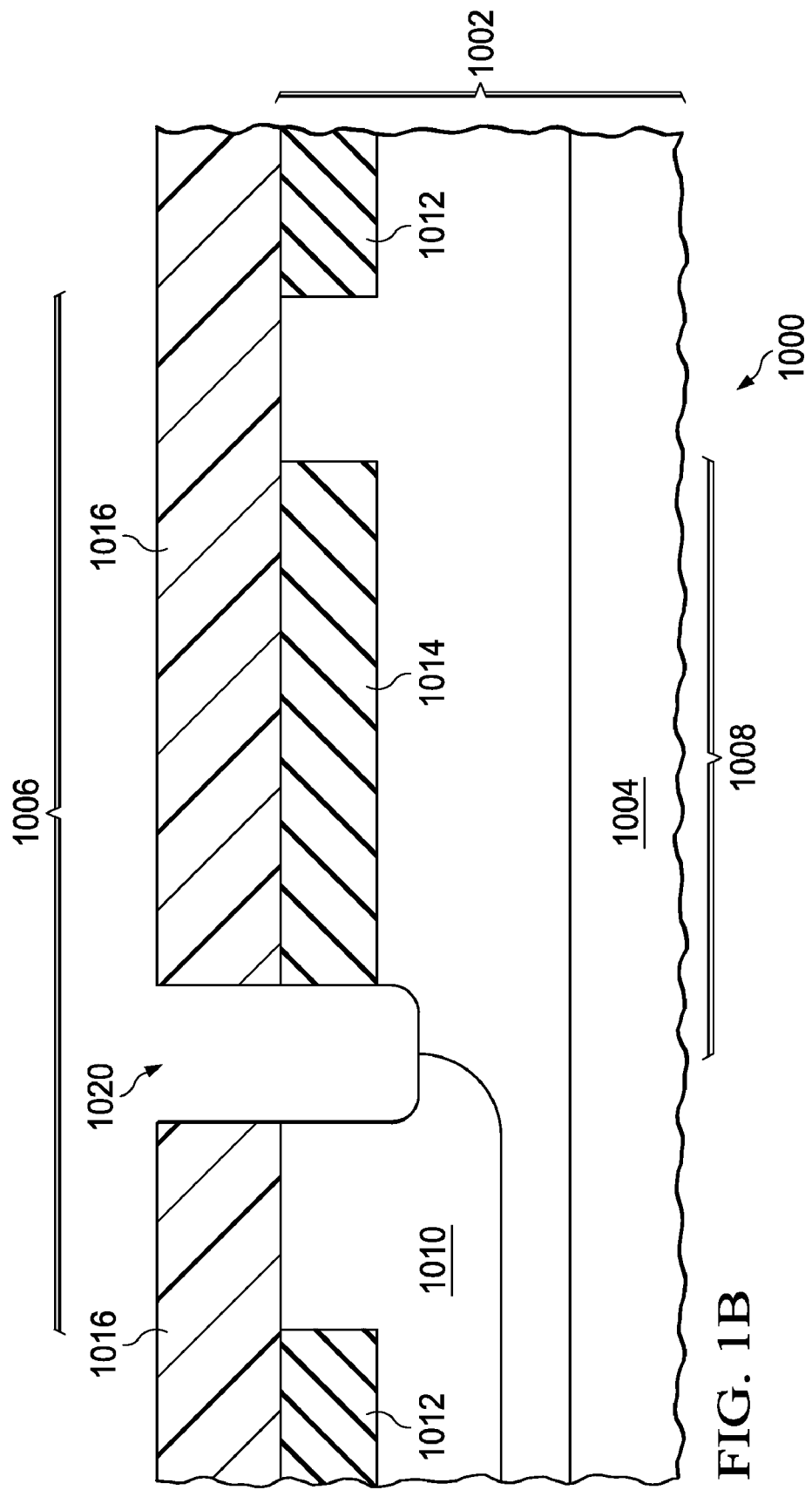

Referring to FIG. 1B, a gate trench (1020) is etched in the substrate (1002) in the gate trench area defined by the gate trench photoresist pattern (1016). In one embodiment, a bottom surface of the gate trench (1020) may be deeper than a bottom surface of the isolation dielectric layer (1014), as depicted in FIG. 1B. In another embodiment, the bottom surface of the gate trench (1020) may be substantially even with the bottom surface of the isolation dielectric layer (1014). In a further embodiment, the bottom surface of the gate trench (1020) may be shallower than the bottom surface of the isolation dielectric layer (1014). The gate trench (1020) may be etched using a fluorine containing plasma during an anisotropic reactive ion etch (RIE) process, or using an isotropic etch process such as immersing the substrate (1002) in a choline solution, or a combination of an anisotropic etch process and an isotropic etch process. Bottom edges of the gate trench (1020) may be rounded by any of various processes such as wet etching. After the gate trench (1020) is formed, the gate trench photoresist pattern (1016) is removed, commonly by exposing the IC (1000) to an oxygen containing plasma, followed by a wet cleanup to remove any organic residue from the top surface of the IC (1000).

Figure 1C:
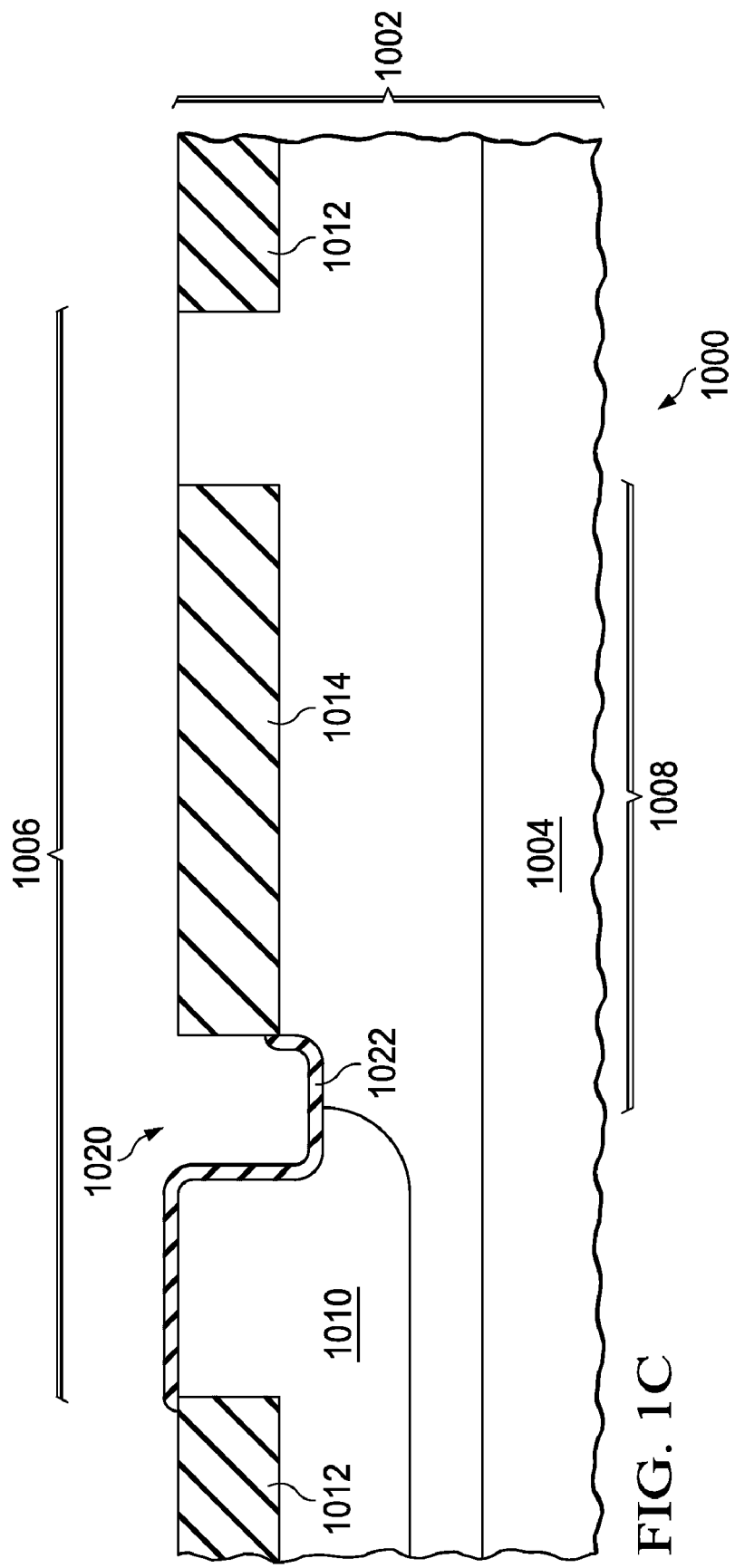

Referring to FIG. 1C, a gate dielectric layer (1022) is formed on exposed surfaces of the substrate (1002) in and adjacent to the gate trench (1020). The gate dielectric layer (1022) may be one or more layers of silicon dioxide ($SiO_2$), silicon oxy-nitride (SiON), aluminum oxide ($Al_2O_3$), aluminum oxy-nitride (AlON), hafnium oxide (HfO), hafnium silicate (HfSiO), hafnium silicon oxy-nitride (HfSiON), zirconium oxide (ZrO), zirconium silicate (ZrSiO), zirconium silicon oxy-nitride (ZrSiON), a combination of the aforementioned materials, or other insulating material. The gate dielectric layer (1022) may include nitrogen as a result of exposure to a nitrogen containing plasma or a nitrogen containing ambient gas at temperatures between 50 C and 800 C. The gate dielectric layer (1022) is typically between 1 and 10 nanometers thick. The gate dielectric layer (1022) may be formed by any of a variety of gate dielectric formation processes, for example thermal oxidation, plasma nitridation of an oxide layer, and/or dielectric material deposition by atomic layer deposition (ALD). An additional gate dielectric layer (not shown) may be grown on exposed surfaces of the substrate (1002) in the drain region of the transistor (1006).

Figure 1D:
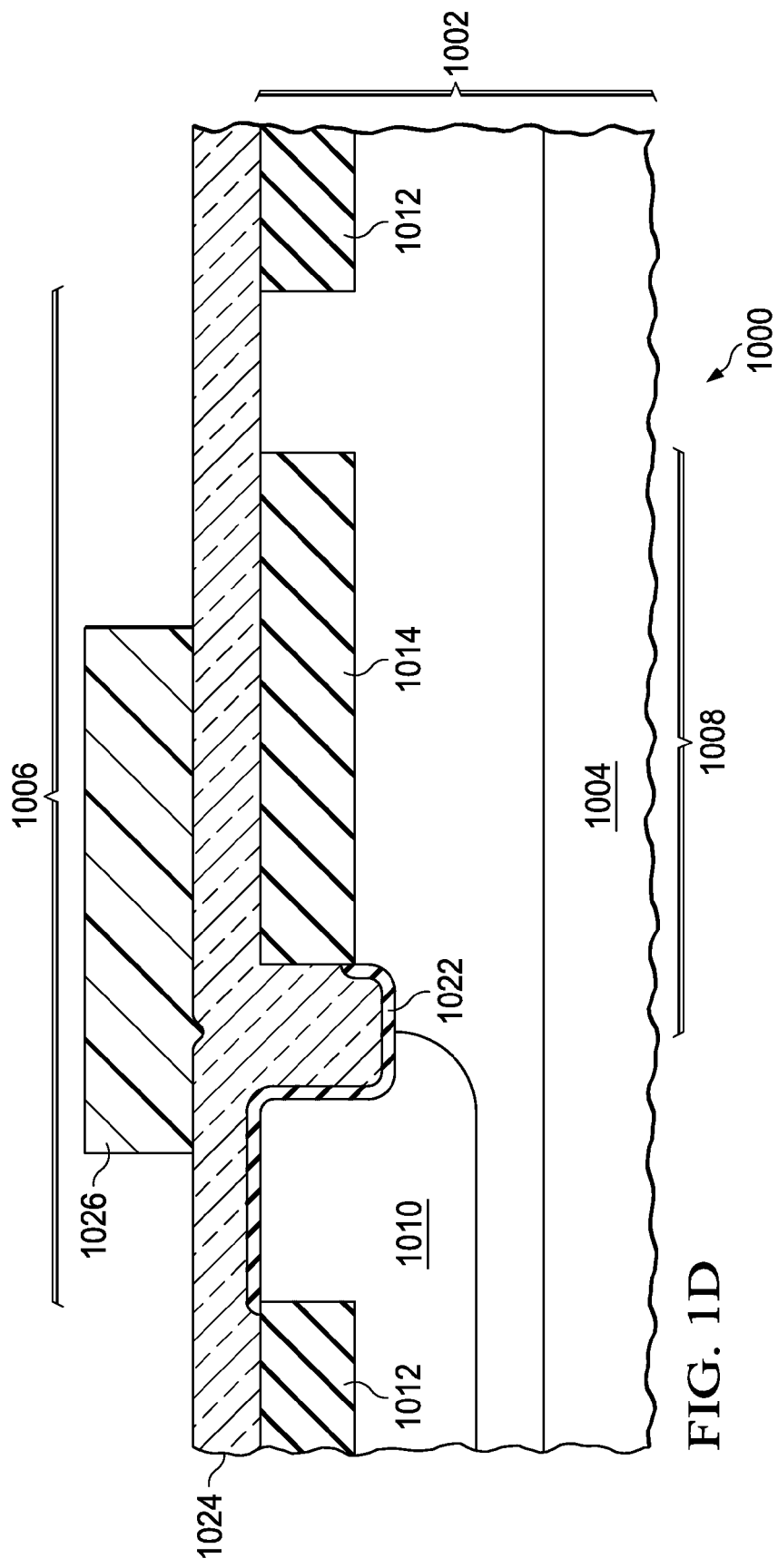

Referring to FIG. 1D, a gate layer (1024) is formed on an existing top surface of the integrated circuit (1000), including exposed surfaces of the gate dielectric layer (1022) in the gate trench (1020). The gate layer (1024) may be formed of polycrystalline silicon, commonly known as polysilicon, or other conductive material such as titanium nitride. In one embodiment, a gate photoresist pattern (1026) is formed on a top surface of the gate layer (1024) to define an area for a gate of the transistor (1006). The area for the gate defined by the gate photoresist pattern (1026) overlaps the gate trench (1020).

Figure 1E:
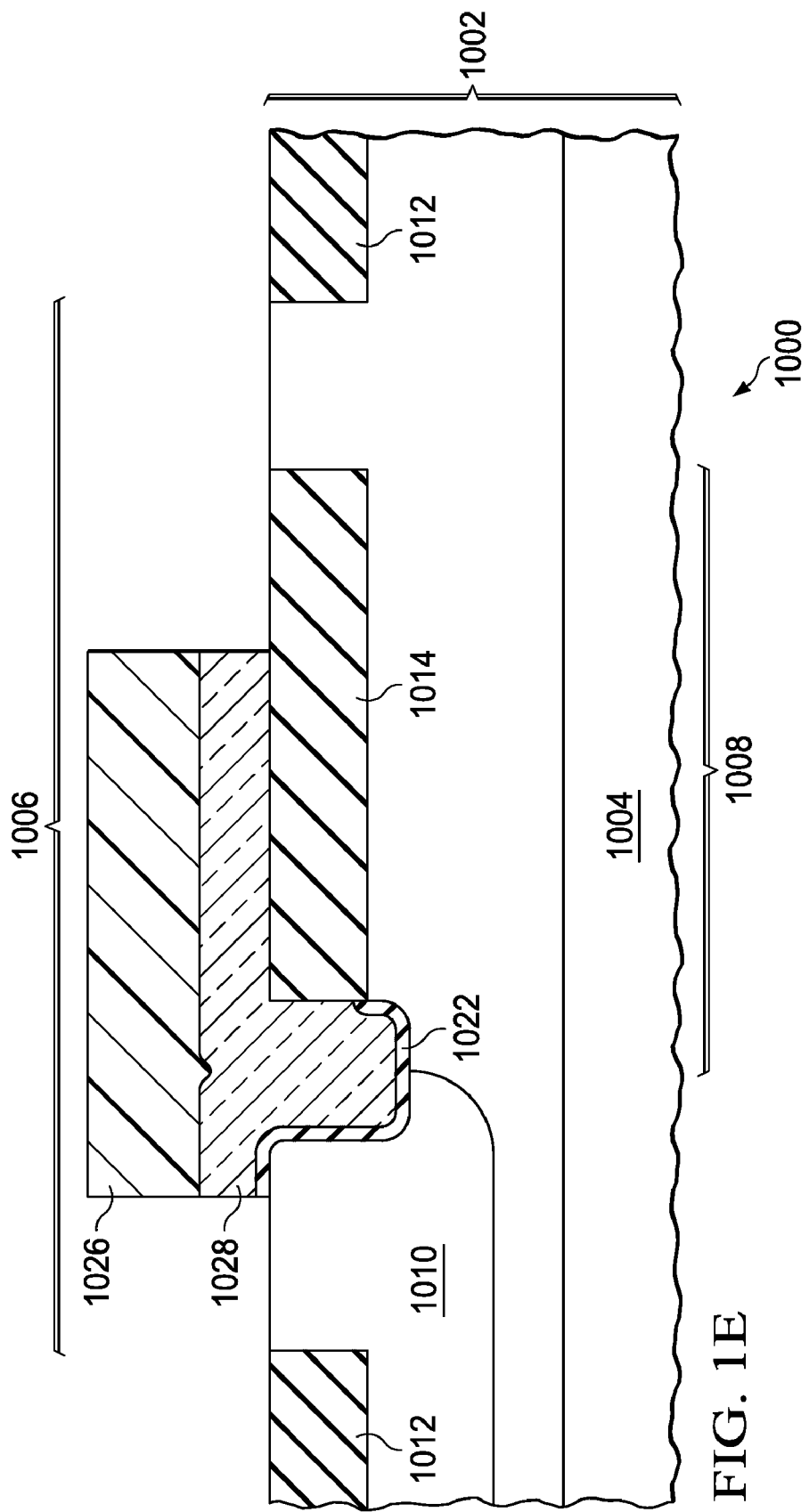

Referring to FIG. 1E, a gate (1028) is formed by removing unwanted material from the gate layer. In embodiments using gate photoresist patterns, unwanted gate layer material may be removed using etch processes such as RIE, to leave the gate (1028) as depicted in FIG. 1E. In some embodiments, the gate (1028) may overlap a portion of the isolation dielectric layer (1014). After the gate (1028) is formed, the gate photoresist pattern (1026) is removed, as described in reference to the gate trench photoresist pattern depicted in FIG. 1B. In other embodiments, gate layer material may be removed from the top surface of the substrate (1002) using planar removal processes such as chemical mechanical polish (CMP) or isotropic etchback, to form the gate (1028) in the gate trench, so that a top surface of the gate (1028) is substantially coplanar with the top surface of the substrate (1002) adjacent to the gate trench.

Figure 1F:
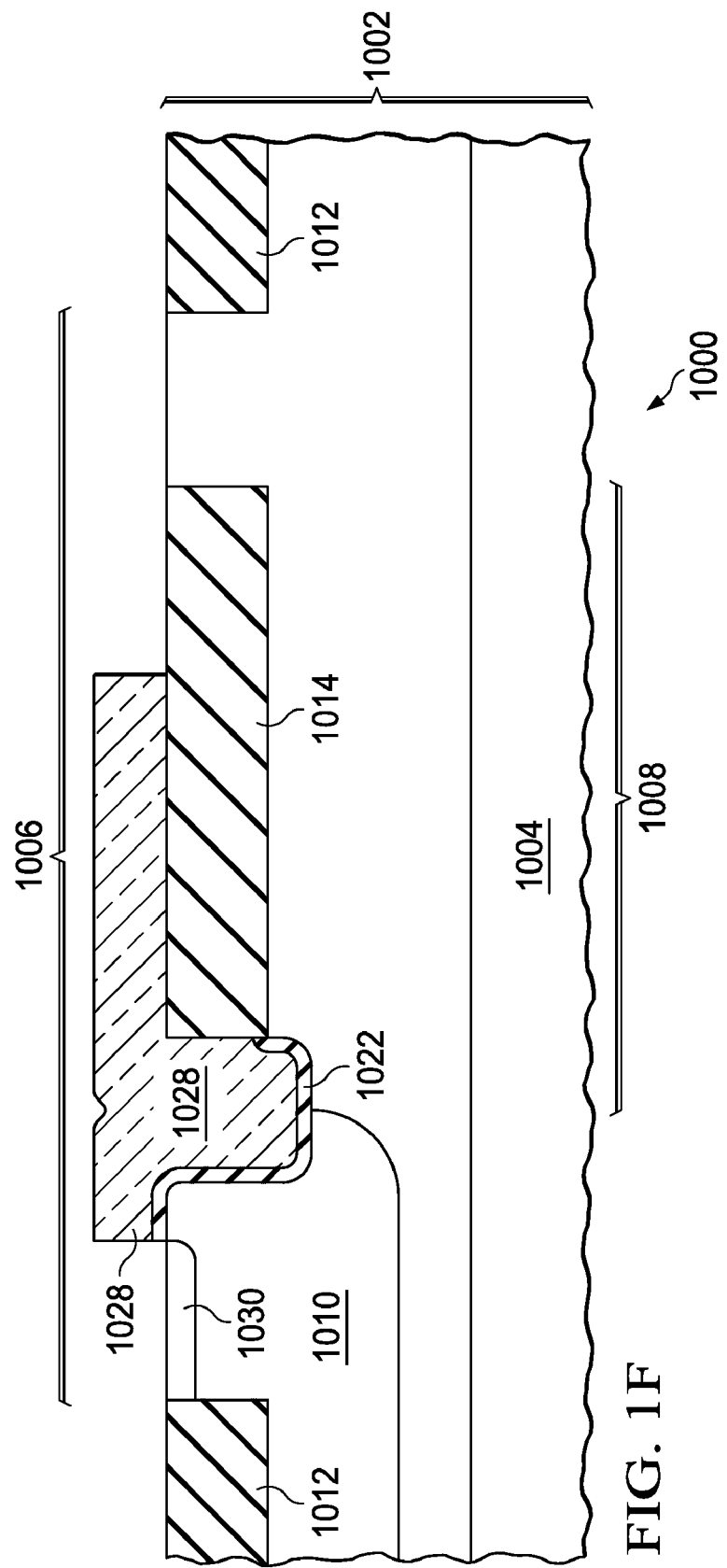

Referring to FIG. 1F, an optional source lightly doped drain (LDD) implanted region (1030) is formed in the source region of the transistor (1006), by ion implanting dopants into the substrate (1002) in the source region. A conductivity type of the source LDD implanted region (1030) is the same as the drain region and the drift region (1008). An optional drain LDD implanted region (not shown) may be formed in the drain region concurrently with the source LDD implanted region (1030). A total dose of dopants in the source LDD implanted region (1030) may be between $3·10^{14}$ and $3·10^{15}$ atoms/cm$^2$. The source LDD implanted region (1030) extends from the top surface of the substrate (1002) to a depth between 10 nanometers and the depth of the gate trench.

Figure 1G:
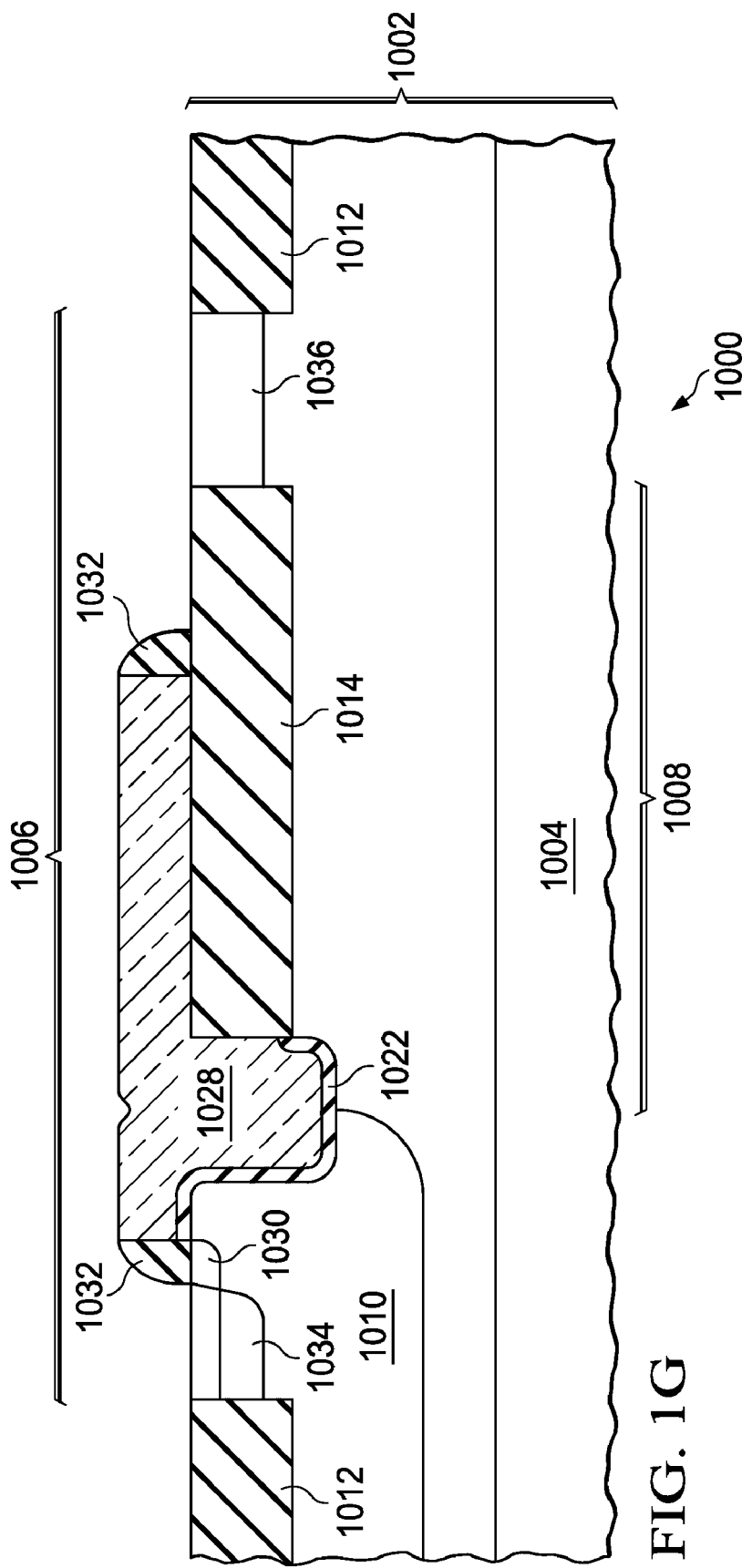

Referring to FIG. 1G, optional sidewall spacers (1032) may be formed on lateral surfaces of the gate (1028). The sidewall spacers (1032) may be formed by deposition of one or more conformal layers of silicon nitride and/or silicon dioxide on a top and lateral surfaces of the gate (1028) and the top surface of the substrate (1002), followed by removal of the conformal layer material from the top surface of the gate (1028) and the top surface of the substrate (1002) by known anisotropic etching methods, leaving the conformal layer material on the lateral surfaces of the gate (1028). A source implanted region (1034) is formed by implanting dopants into the substrate (1002) in the source region adjacent to the sidewall spacers (1032), if formed, or the gate (1028) if no sidewall spacers are present. A dose of the source implanted region (1034) may be between $3·10^{14}$ and $1·10^{16}$ atoms/cm$^2$. The source implanted region (1034) extends from the top surface of the substrate (1002) to a depth between 100 and 1000 nanometers. A conductivity type of the source implanted region (1034) is the same as the source LDD implanted region (1030).

A drain implanted region (1036) is formed by ion implanting dopants into the substrate (1002) in the drain region proximate to the isolation dielectric layer (1014). A conductivity type of the source implanted region (1034) is the same as the source implanted region (1032). In some embodiments, the drain implanted region (1036) is formed concurrently with the source implanted region (1034).

Figure 1H:
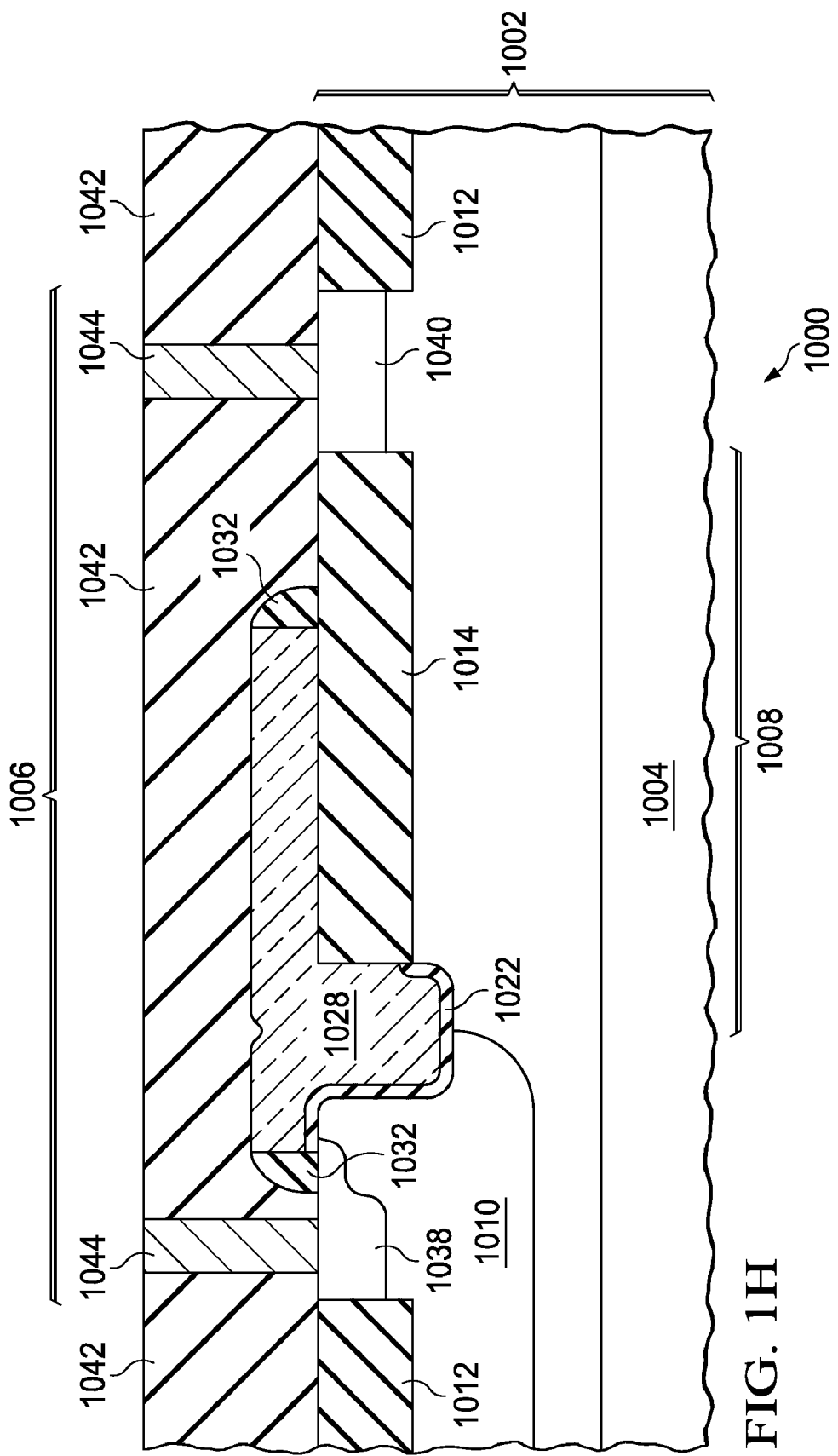

Referring to FIG. 1H, an anneal operation is performed which activate a portion of the dopants implanted into the source LDD implanted region, the source implanted region and the drain implanted region to form a source diffused region (1038) and a drain diffused region (1040). Optional layers of metal silicide (not shown) may be formed on top surfaces of the source diffused region (1038), the drain diffused region (1040), or the gate (1028).

A pre-metal dielectric (PMD) layer (1042) is formed on an existing top surface of the integrated circuit (1000). The PMD layer (1042) is typically a dielectric layer stack including a PMD liner, a PMD main layer, and an optional PMD cap layer. The PMD liner is commonly silicon nitride or silicon dioxide, 10 to 100 nanometers thick, deposited by plasma enhanced chemical vapor deposition (PECVD) on the integrated circuit (1000). The PMD main layer is commonly a layer of silicon dioxide, phospho-silicate glass (PSG) or boro-phospho-silicate glass (BPSG), commonly 100 to 1000 nanometers thick, deposited by PECVD on a top surface of the PMD liner, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer. Source and drain contacts (1044) are formed in the PMD layer (1042) to make electrical connections to the source diffused region (1038) and the drain diffused region (1040). The contacts (1044) may be formed by defining contact areas on a top surface of the PMD layer (1042) with a contact photoresist pattern (not shown), etching contact holes in the contact areas by removing PMD layer material using known etching methods to expose the source diffused region (1038) and the drain diffused region (1040), and filling the contact holes with a contact liner metal, such as titanium, and a contact fill metal, typically tungsten, followed by removal of the contact fill metal from the top surface of the PMD layer (1042) using known etching and/or CMP methods.

During operation of the transistor (1006) depicted in FIG. 1H, the gate (1028) is biased so as to form an inversion layer under the gate dielectric layer (1022), and possibly adjacent to lateral surfaces of the gate dielectric layer (1022), in the body well (1010). Forming the transistor (1006) with the gate (1028) in the gate trench allows current to flow directly from the inversion layer to the drift region (1008) without passing through a confined semiconductor region, which may advantageously increase an on-state current in the transistor (1006). In embodiments in which the gate (1028) overlaps the isolation dielectric layer (1012), an electric field at an interface between the isolation dielectric layer (1012) and the drift region 1008) may be advantageously reduced, allowing operation of the transistor (1006) at a higher drain potential. In other embodiments, a separate field plate may be formed on a to surface of the isolation dielectric layer (1012) to enable a reduction of an electric field at an interface between the isolation dielectric layer (1012) and the drift region (1008).

Figure 2G:
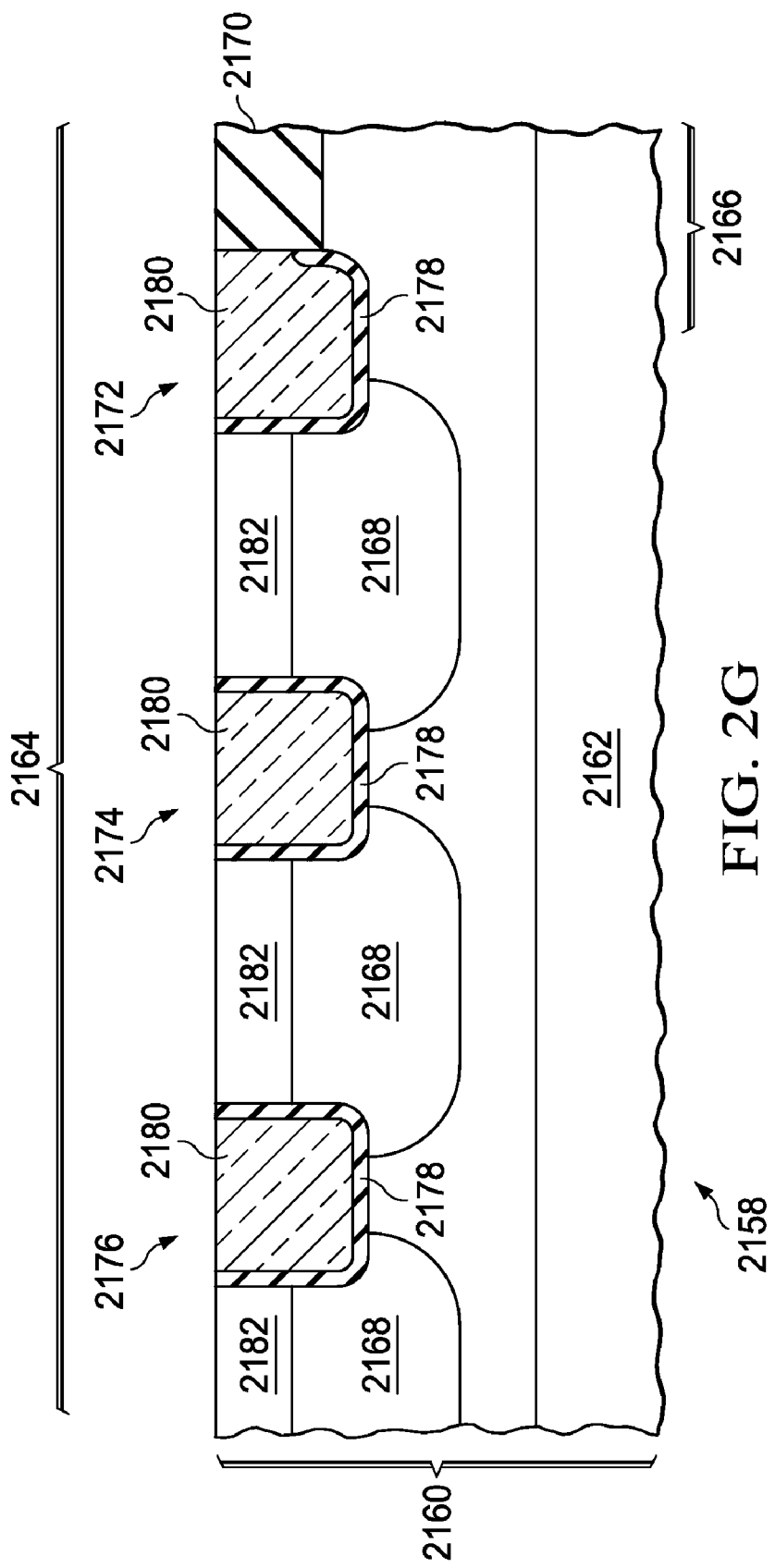

FIG. 2A through FIG. 2G are cross-sections of integrated circuits containing transistors formed according to embodiments of the instant invention, with different configurations of gate and source regions. The embodiments depicted in FIG. 2A through FIG. 2G are meant to be exemplary, but not comprehensive. Referring to FIG. 2A, a first integrated circuit (2000) is formed in and on a first substrate (2002) as described in reference to FIG. 1A. An optional first heavily doped buried layer (2004) may be formed under the first transistor (2006) and an optional first field oxide element (2008) may be formed to isolate the first transistor (2006) from other components in the first integrated circuit (2000), as described in reference to FIG. 1A. The first transistor (2006) includes a first drift region (2010), a first body well (2012) and a first isolation dielectric layer (2014) formed over the first drift region (2010), as described in reference to FIG. 1A.

A first gate trench (2016) is formed in the first substrate (2002) adjacent to the first isolation dielectric layer (2014), as described in reference to FIG. 1B and FIG. 1C. A bottom surface of the first gate trench (2016) is substantially coplanar with a bottom surface of the first isolation dielectric layer (2014).

A first gate dielectric layer (2018) is formed on exposed surfaces of the first substrate (2002) in and adjacent to the first gate trench (2016), as described in reference to FIG. 1C. A first gate (2020) is formed in the first gate trench (2016) on the first gate dielectric layer (2018), as described in reference to FIG. 1D and FIG. 1E. In the instant embodiment, the first gate (2020) may be formed conformally in the first gate trench (2016) as depicted in FIG. 2A. A stress layer (2022) is formed on a top surface of the first gate (2020) which may provide a desired level of tensile or compressive stress to a channel region in the first body well (2012) adjacent to the first gate dielectric layer (2018). The stress layer (2022) may be formed, for example, of metal silicide, silicon nitride, or other material with a desired stress and compatibility with fabrication of the first integrated circuit (2000). A first sidewall spacer (2024) may be formed on lateral surfaces of the first gate (2020), as described in reference to FIG. 1G. A first source diffused region (2026) is formed in the body well (2012) as described in reference to FIG. F through FIG. 1H.

The first transistor (2006) is operated as described in reference to FIG. 1H. Forming the first gate trench (2016) so that its bottom surface is substantially coplanar with the bottom surface of the first isolation dielectric layer (2014) may provide reduced series resistance compared to a configuration in which a gate trench bottom surface is shallower than an isolation dielectric layer bottom surface, and higher gate-drain breakdown voltage than a configuration in which a gate trench bottom surface is deeper than an isolation dielectric layer bottom surface.

Referring to FIG. 2B, a second integrated circuit (2028) is formed in and on a second substrate (2030) as described in reference to FIG. 1A. An optional second heavily doped buried layer (2032) may be formed under the second transistor (2034) and an optional second field oxide element (2036) may be formed to isolate the second transistor (2034) from other components in the second integrated circuit (2028), as described in reference to FIG. 1A. The second transistor (2034) includes a second drift region (2038), a second body well (2040) and a second isolation dielectric layer (2042) formed over the second drift region (2038), as described in reference to FIG. 1A.

A second gate trench (2044) is formed in the second substrate (2030) adjacent to the second isolation dielectric layer (2042), as described in reference to FIG. 1B and FIG. 1C. A bottom surface of the second gate trench (2044) is shallower than a bottom surface of the second isolation dielectric layer (2042).

A second gate dielectric layer (2046) is formed on exposed surfaces of the second substrate (2030) in and adjacent to the second gate trench (2044), as described in reference to FIG. 1C. A second gate (2048) is formed in the second gate trench (2044) on the second gate dielectric layer (2046), as described in reference to FIG. 1D and FIG. 1E. A second sidewall spacer (2050) may be formed on lateral surfaces of the second gate (2048), as described in reference to FIG. 1G. A second source diffused region (2052) is formed in the body well (2040) as described in reference to FIG. F through FIG. 1H.

The second transistor (2034) is operated as described in reference to FIG. 1H. Forming the second gate trench (2044) so that its bottom surface is shallower than the bottom surface of the second isolation dielectric layer (2042) may provide increased breakdown voltage compared to configurations in which the gate trench bottom surface is deeper than the isolation dielectric layer bottom surface, and increased gate trench etch process latitude compared to a configuration in which a gate trench bottom surface is substantially coplanar with an isolation dielectric layer bottom surface.

Referring to FIG. 2C, a third integrated circuit (2054) is formed in and on a third substrate (2056) as described in reference to FIG. 1A. An optional third heavily doped buried layer (2058) may be formed under the third transistor (2060) and an optional third field oxide element (2062) may be formed to isolate the third transistor (2060) from other components in the third integrated circuit (2054), as described in reference to FIG. 1A. The third transistor (2060) includes a third drift region (2064), a third body well (2066) and a third isolation dielectric layer (2068) formed over the third drift region (2064), as described in reference to FIG. 1A.

A third gate trench (2070) is formed in the third substrate (2056) adjacent to the third isolation dielectric layer (2068), as described in reference to FIG. 1B and FIG. 1C. A bottom surface of the third gate trench (2070) is substantially coplanar with a bottom surface of the third isolation dielectric layer (2068).

A third gate dielectric layer (2072) is formed on exposed surfaces of the third substrate (2056) in and adjacent to the third gate trench (2070), as described in reference to FIG. 1C. A third gate (2074) is formed in the third gate trench (2070) on the third gate dielectric layer (2072), as described in reference to FIG. 1D and FIG. 1E. In the instant embodiment, the third gate (2074) has a lateral overlap of a source region of the third transistor (2060) of less than 20 nanometers. A third sidewall spacer (2076) may be formed on lateral surfaces of the third gate (2074), as described in reference to FIG. 1G. A third source diffused region (2078) is formed in the body well (2066) as described in reference to FIG. F through FIG. 1H, such that the third source diffused region (2078) contacts a vertical face of the third gate dielectric layer (2072). In the instant embodiment, the third body well (2066) may abut the vertical face of the third gate dielectric layer (2072) and not overlap the bottom surface of the third gate trench (2070), as depicted in FIG. 2C.

The third transistor (2060) is operated as described in reference to FIG. 1H. Forming the third gate (2074) so that the third source diffused region (2078) contacts the vertical face of the third gate dielectric layer (2072) may provide reduced inversion channel length compared to a configuration in which a source diffused region is laterally separated from a vertical face of a gate dielectric layer, which may advantageously provide a higher on-state current of the third transistor (2060).

Referring to FIG. 2D, a fourth integrated circuit (2080) is formed in and on a fourth substrate (2082) as described in reference to FIG. 1A. An optional fourth heavily doped buried layer (2084) may be formed under the fourth transistor (2086) and an optional fourth field oxide element (2088) may be formed to isolate the fourth transistor (2086) from other components in the fourth integrated circuit (2080), as described in reference to FIG. 1A. The fourth transistor (2086) includes a fourth drift region (2090), a fourth body well (2092) and a fourth isolation dielectric layer (2094) formed over the fourth drift region (2090), as described in reference to FIG. 1A.

A fourth gate trench (2096) is formed in the fourth substrate (2082) adjacent to the fourth isolation dielectric layer (2094), as described in reference to FIG. 1B and FIG. 1C. A bottom surface of the fourth gate trench (2096) is deeper than a bottom surface of the fourth isolation dielectric layer (2094).

A fourth gate dielectric layer (2098) is formed on exposed surfaces of the fourth substrate (2082) in and adjacent to the fourth gate trench (2096), as described in reference to FIG. 1C. A fourth gate (2100) is formed in the fourth gate trench (2096) on the fourth gate dielectric layer (2098), as described in reference to FIG. 1D and FIG. 1E. In the instant embodiment, the fourth gate (2100) has a lateral overlap of a source region of the fourth transistor (2086) of less than 20 nanometers. A fourth sidewall spacer (2102) may be formed on lateral surfaces of the fourth gate (2100), as described in reference to FIG. 1G. A fourth source diffused region (2104) is formed in the body well (2092) as described in reference to FIG. F through FIG. 1H, such that the fourth source diffused region (2104) contacts a vertical face of the fourth gate dielectric layer (2098).

The fourth transistor (2086) is operated as described in reference to FIG. 1H. Forming the fourth gate (2100) so that the fourth source diffused region (2104) contacts the vertical face of the fourth gate dielectric layer (2098) may provide reduced inversion channel length compared to a configuration in which a source diffused region is laterally separated from a vertical face of a gate dielectric layer, which may advantageously provide a higher on-state current of the fourth transistor (2086).

Referring to FIG. 2E, a fifth integrated circuit (2106) is formed in and on a fifth substrate (2108) as described in reference to FIG. 1A. An optional fifth heavily doped buried layer (2110) may be formed under the fifth transistor (2112) and an optional fifth field oxide element (2114) may be formed to isolate the fifth transistor (2112) from other components in the fifth integrated circuit (2106), as described in reference to FIG. 1A. The fifth transistor (2112) includes a fifth drift region (2116), a fifth body well (2118) and a fifth isolation dielectric layer (2120) formed over the fifth drift region (2116), as described in reference to FIG. 1A.

A fifth gate trench (2122) is formed in the fifth substrate (2108) adjacent to the fifth isolation dielectric layer (2120), as described in reference to FIG. 1B and FIG. 1C. A bottom surface of the fifth gate trench (2122) may be deeper than a bottom surface of the fifth isolation dielectric layer (2120) as depicted in FIG. 2E, may be substantially coplanar with the bottom surface of the fifth isolation dielectric layer (2120), or may be shallower than the bottom surface of the fifth isolation dielectric layer (2120).

In the instant embodiment, a doping density of the fifth body well (2118) at lateral surfaces and the bottom surface of the fifth gate trench (2122) is substantially constant. The substantially constant doping density may be formed, for example, by forming a diffusion barrier such as silicon nitride on an existing top surface of the fifth integrated circuit (2106) including the fifth gate trench (2122), removing the diffusion barrier from an area defined for a channel of the fifth transistor (2112), and performing a thermal diffusion of dopants through exposed surfaces of the fifth gate trench (2122) into adjacent regions of the fifth substrate (2108).

A fifth source diffused region (2124) is formed in the fifth body well (2118). In the instant embodiment, the fifth source diffused region (2124) extends from the top surface of the fifth substrate (2108) to a depth below the fifth gate trench (2122). In one realization of the instant embodiment, a lateral distance from a boundary of the fifth source diffused region (2124) to a boundary of the fifth body well (2118) is substantially constant on lateral surfaces and the bottom surface of the fifth gate trench (2122), so as to provide a substantially constant channel length across the transistor (2112). In one realization, a portion of the fifth source diffused region (2124) may be formed by thermally diffusing dopants through exposed surfaces of the fifth gate trench (2122) into adjacent regions of the fifth substrate (2108) using a similar process to that described for forming the fifth body well (2118).

A fifth gate dielectric layer (2126) is formed on exposed surfaces of the fifth substrate (2108) in and adjacent to the fifth gate trench (2122), as described in reference to FIG. 1C. A fifth gate (2128) is formed in the fifth gate trench (2122) on the fifth gate dielectric layer (2126), as described in reference to FIG. 1D and FIG. 1E. A fifth sidewall spacer (2130) may be formed on lateral surfaces of the fifth gate (2128), as described in reference to FIG. 1G.

The fifth transistor (2112) is operated as described in reference to FIG. 1H. Forming the fifth body well (2118) to have a substantially constant doping density at the lateral surfaces and bottom surface of the fifth gate trench (2122) may provide an increased channel width with more uniform threshold compared to a configuration in which a source diffused region is less deep than a corresponding gate trench, which may advantageously provide a higher on-state current of the fifth transistor (2112).

Referring to FIG. 2F, a sixth integrated circuit (2132) is formed in and on a sixth substrate (2134) as described in reference to FIG. 1A. An optional sixth heavily doped buried layer (2136) may be formed under the sixth transistor (2138) and an optional sixth field oxide element (2140) may be formed to isolate the sixth transistor (2138) from other components in the sixth integrated circuit (2132), as described in reference to FIG. 1A. The sixth transistor (2138) includes a sixth drift region (2142), a sixth body well (2144) and a sixth isolation dielectric layer (2146) formed over the sixth drift region (2142), as described in reference to FIG. 1A. In the instant embodiment, a top surface of the sixth body well (2144) is located below a top surface of the sixth substrate (2134).

A sixth gate trench (2148) is formed in the sixth substrate (2134) adjacent to the sixth isolation dielectric layer (2146), as described in reference to FIG. 1B and FIG. 1C. A bottom surface of the sixth gate trench (2148) may be deeper than a bottom surface of the sixth isolation dielectric layer (2146) as depicted in FIG. 2F, may be substantially coplanar with the bottom surface of the sixth isolation dielectric layer (2146), or may be shallower than the bottom surface of the sixth isolation dielectric layer (2146).

A sixth source diffused region (2150) is formed in the sixth body well (2144). In the instant embodiment, the sixth source diffused region (2150) extends from the top surface of the sixth substrate (2134) to a depth below the sixth gate trench (2148). In one realization of the instant embodiment, a portion of the sixth source diffused region (2150) may be formed by thermally diffusing dopants through exposed surfaces of the sixth gate trench (2148) into adjacent regions of the sixth substrate (2134) using a similar process to that described for forming the fifth source diffused region (2124) in reference to FIG. 2E.

A sixth gate dielectric layer (2152) is formed on exposed surfaces of the sixth substrate (2134) in and adjacent to the sixth gate trench (2148), as described in reference to FIG. 1C. A sixth gate (2154) is formed in the sixth gate trench (2148) on the sixth gate dielectric layer (2152), as described in reference to FIG. 1D and FIG. 1E. A sixth sidewall spacer (2156) may be formed on lateral surfaces of the sixth gate (2154), as described in reference to FIG. 1G.

The sixth transistor (2138) is operated as described in reference to FIG. 1H. Forming the source diffused region (2150) to extend to the bottom surface of the sixth gate trench (2148) may provide an increased channel width compared to a configuration in which a source diffused region is less deep than a corresponding gate trench, which may advantageously provide a higher on-state current of the sixth transistor (2138).

Referring to FIG. 2G, a seventh integrated circuit (2158) is formed in and on a seventh substrate (2160) as described in reference to FIG. 1A. A seventh heavily doped buried layer (2162) is formed under the seventh transistor (2164) as described in reference to FIG. 1A. The seventh transistor (2158) includes a seventh drift region (2166), a seventh body well (2168) and a seventh isolation dielectric layer (2170) formed over the seventh drift region (2166), as described in reference to FIG. 1A. A boundary of the seventh body well (2168) intersects regions for gate trenches so as to form channel regions for the seventh transistor (2158). In the instant embodiment, a doping density of the seventh heavily doped buried layer (2162) is more than 10 times a doping density of the seventh drift region (2166).

A seventh gate trench set includes a first trench (2172) formed in the seventh substrate (2160) adjacent to the seventh isolation dielectric layer (2170), as described in reference to FIG. 1B and FIG. 1C. A bottom surface of the first trench (2172) may be deeper than a bottom surface of the seventh isolation dielectric layer (2170) as depicted in FIG. 2G, may be substantially coplanar with the bottom surface of the seventh isolation dielectric layer (2170), or may be shallower than the bottom surface of the seventh isolation dielectric layer (2170). The seventh gate trench set includes a second trench (2174) formed in the seventh substrate (2160) proximate to the first trench (2172) opposite the seventh isolation dielectric layer (2170). A bottom surface of the second trench (2174) may be deeper than the bottom surface of the seventh isolation dielectric layer (2170) as depicted in FIG. 2G, may be substantially coplanar with the bottom surface of the seventh isolation dielectric layer (2170), or may be shallower than the bottom surface of the seventh isolation dielectric layer (2170). The seventh gate trench set may further include an optional third trench (2176) formed in the seventh substrate (2160) proximate to the second trench (2174) opposite the first trench (2172). In one realization of the instant embodiment, the first trench (2172), second trench (2174) and third trench (2176) may be formed concurrently. In an alternate realization, the trenches (2170, 2172, 2174) may be formed separately.

A seventh gate dielectric layer (2178) is formed on exposed surfaces of the first trench (2172), second trench (2174) and third trench (2176) if present, as described in reference to FIG. 1C. A seventh gate (2180) is formed in the first trench (2172), second trench (2174) and third trench (2176) if present, on the seventh gate dielectric layer (2178), as described in reference to FIG. 1D and FIG. 1E. In one realization of the instant embodiment, the seventh gate (2180) may be planarized so that a top surface of the seventh gate (2180) is substantially coplanar with a top surface of the seventh substrate (2160) as depicted in FIG. 2G. In an alternate realization, the seventh gate (2180) may overlap the top surface of the seventh substrate (2160).

A seventh source diffused region (2182) is formed in the seventh body well (2168) as described in reference to FIG. F through FIG. 1H, such that the seventh source diffused region (2182) contacts vertical faces of the seventh gate dielectric layer (2178) at the first trench (2172), second trench (2174) and third trench (2176) if present.

The seventh transistor (2164) is operated as described in reference to FIG. 1H. Current may flow from the seventh source diffused region (2182) through a channel region adjacent to the first trench (2172) laterally into the seventh drift region (2166). Current may further flow from the seventh source diffused region (2182) through a channel region adjacent to the second trench (2174) vertically into the seventh heavily doped buried layer (2162). If the third trench (2176)

is present, current may further flow from the seventh source diffused region (2182) through a channel region adjacent to the third trench (2176) vertically into the seventh heavily doped buried layer (2162). Forming the second trench (2174) and third trench (2176) if present may provide additional current paths compared to a configuration with one gate trench, which may advantageously provide a higher on-state current of the seventh transistor (2164).

A body well in a transistor formed according to an embodiment of the instant invention may be formed prior to forming a gate of the transistor, or may be formed after forming the gate of the transistor, depending on desired levels of on-state current. FIG. 3 and FIG. 4 are cross-sections of integrated circuits containing transistors formed according to embodiments of the instant invention, in which body wells are formed prior to and after, respectively, formation of gates of the transistors. Referring to FIG. 3, an integrated circuit (3000) is formed in and on a substrate (3002) as described in reference to FIG. 1A. An isolation dielectric layer (3004) is formed over a drift region (3006) in a transistor (3008) which is formed according to an embodiment of the instant invention. A body well photoresist pattern (3010) is formed on a top surface of the integrated circuit (3000) to define an area for implanting body well dopants. A body well ion implant process (3012) is performed which implants the body well dopants into the substrate (3002) to form a body well implanted region (3014). In subsequent steps, a gate trench will be formed, of which a bottom surface will intersect a boundary of the body well (3014). Forming the body well implanted region (3014) prior to forming a gate trench in the transistor (3006) may provide a longer inversion channel length, which may advantageously provide a desired level of precision or repeatability of an on-state current in the transistor (3006).

Referring to FIG. 4, an integrated circuit (4000) is formed in and on a substrate (4002) as described in reference to FIG. 1A. An isolation dielectric layer (4004) is formed over a drift region (4006) in a transistor (4008) which is formed according to an embodiment of the instant invention. A gate trench is formed abutting or overlapping the isolation dielectric layer (4004) as described in reference to FIG. 1A and FIG. 1B. A gate dielectric layer (4010) is formed on exposed surfaces of the gate trench, as described in reference to FIG. 1C. A gate (4012) is formed in the gate trench on exposed surfaces of the gate dielectric layer (4010), as described in reference to FIG. 1D and FIG. 1E, so that the gate (4012) does not overlap a top surface of the substrate (40020 in a source area of the transistor (4008), as described in reference to FIG. 2D. A body well ion implant process (4014) is performed which implants the body well dopants into the substrate (4002) to form a body well implanted region (4016). The gate (4012) blocks the body well dopants so that a boundary of the body well implanted region (4016) is substantially aligned with a vertical face of the gate dielectric layer (4010). An inversion channel length may be limited to a difference between a depth of the gate trench and a depth of a subsequent source diffused region. Forming the body well implanted region (4016) after forming the gate trench in the transistor (4008) may provide a shorter inversion channel length, which may advantageously provide a desired high level of an on-state current in the transistor (4008).

Figure 5A:
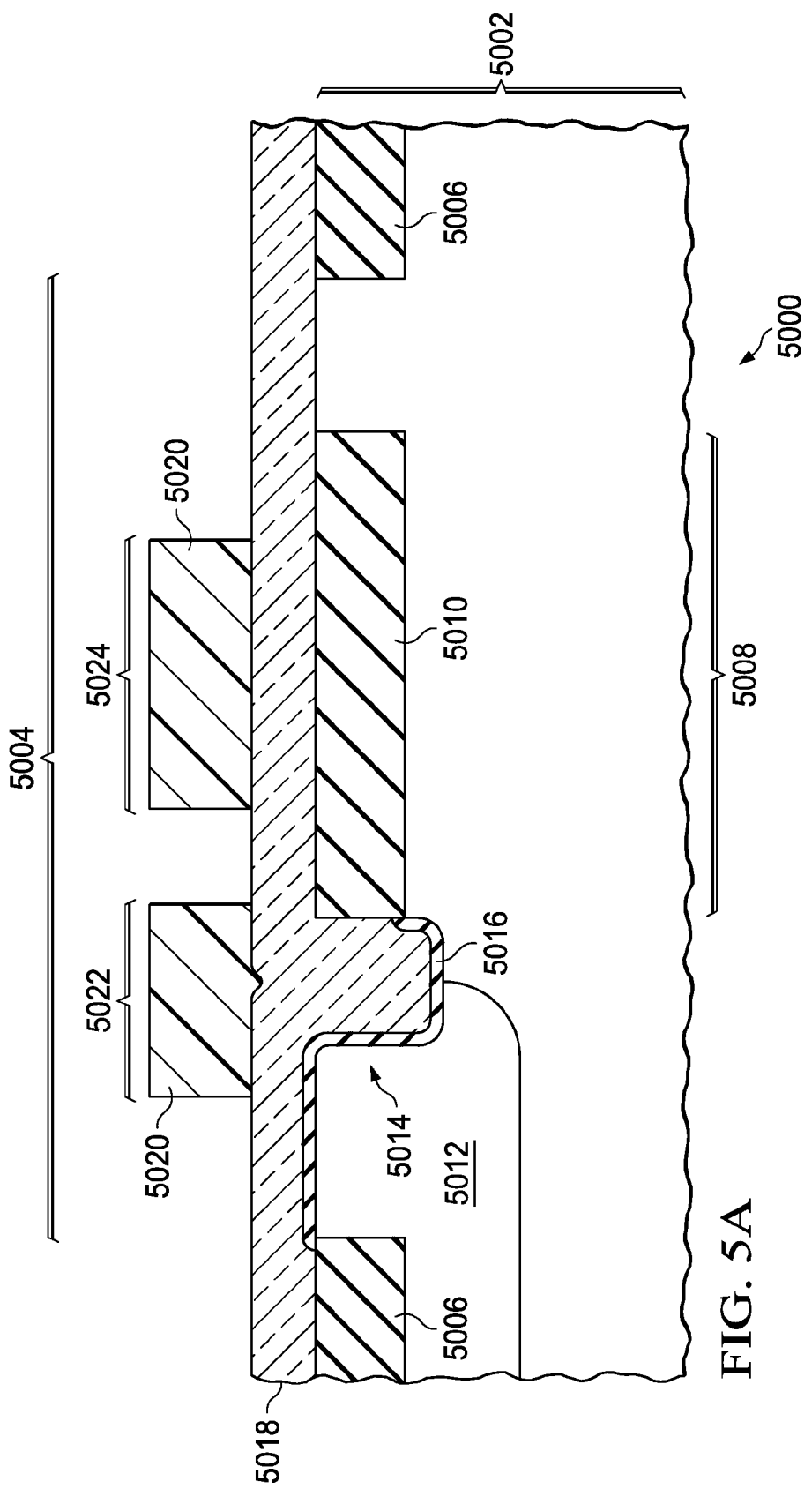
FIG. 5A and FIG. 5B, and FIG. 6A and FIG. 6B depict two exemplary process sequences for forming field plates.

Field plates on isolation dielectric layers in transistors formed according embodiments of the instant invention may provide advantageous reductions in electric fields at interfaces between the isolation dielectric layers and abutting drift regions, as described in reference to FIG. 1H. Field plates may be formed by various process sequences, in addition to the process sequence described in reference to FIG. 1A through FIG. 1H. FIG. 5A and FIG. 5B, and FIG. 6A and FIG. 6B depict two exemplary process sequences for forming field plates. Referring to FIG. 5A, an integrated circuit (5000) is formed in and on a substrate (5002) as described in reference to FIG. 1A. The integrated circuit (5000) contains an area for a transistor (5004) formed according to an embodiment of the instant invention. Optional elements of field oxide (5006) may be formed at a top surface of the substrate (5002) to isolate the transistor (5004) from other components in the integrated circuit (5000) as described in reference to FIG. 1A. A drift region (5008) is formed in the transistor (5004) and an isolation dielectric layer (5010) is formed at the top surface of the substrate (5002) over the drift region (5008) as described in reference to FIG. 1A. A body well (5012) is formed in the transistor (5004) as described in reference to FIG. 1A. A gate trench (5014) is formed in the transistor (5004) in the substrate (5002) abutting, and possibly overlapping, the isolation dielectric layer (5010) as described in reference to FIG. 1A and FIG. 1B. A gate dielectric layer (5016) is formed on exposed surfaces of the gate trench (5014) as described in reference to FIG. 1C. A gate layer (5018) is formed in the gate trench (5014) and on a top surface of the isolation dielectric layer (5010) as described in reference to FIG. 1D. A gate photoresist pattern (5020) is formed on a top surface of the gate layer (5018) to define a gate area (5022) over the gate trench (5014) for a gate of the transistor, as described in reference to FIG. 1D, and to define a field plate area (5024) over the isolation dielectric layer (5010) for a field plate. In the instant embodiment, the gate area (5022) does not abut or overlap the field plate area (5024).

Figure 5B:
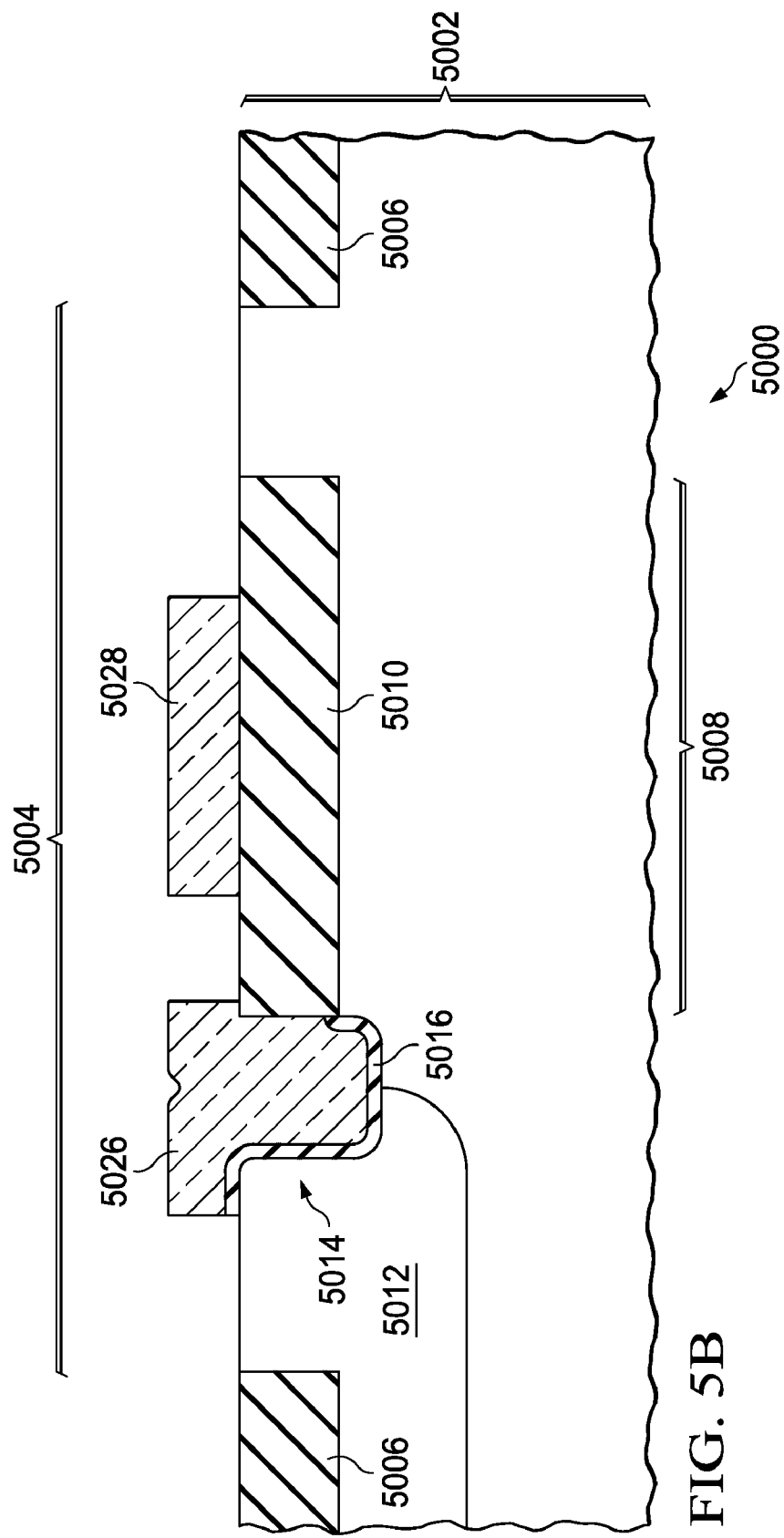

Referring to FIG. 5B, unwanted gate layer material is removed, for example by etching processes described in reference to FIG. 1E to form a gate (5026) in the gate trench (5014) and a field plate (5028) on the isolation dielectric layer (5010). The gate photoresist pattern is removed after the gate (5026) and field plate (5028) are formed, as described in reference to FIG. 1E. Forming the field plate (5028) to be electrically separated from the gate (5026) enables the field plate (5028) to be biased separately from the gate (5026), which may advantageously increase a maximum drain voltage of the transistor (5004). Forming the field plate (5028) concurrently with the gate (5026) advantageously reduces a fabrication cost and complexity of the integrated circuit (5000) compared to embodiments in which field plates and gates are not formed concurrently.

Figure 6A:
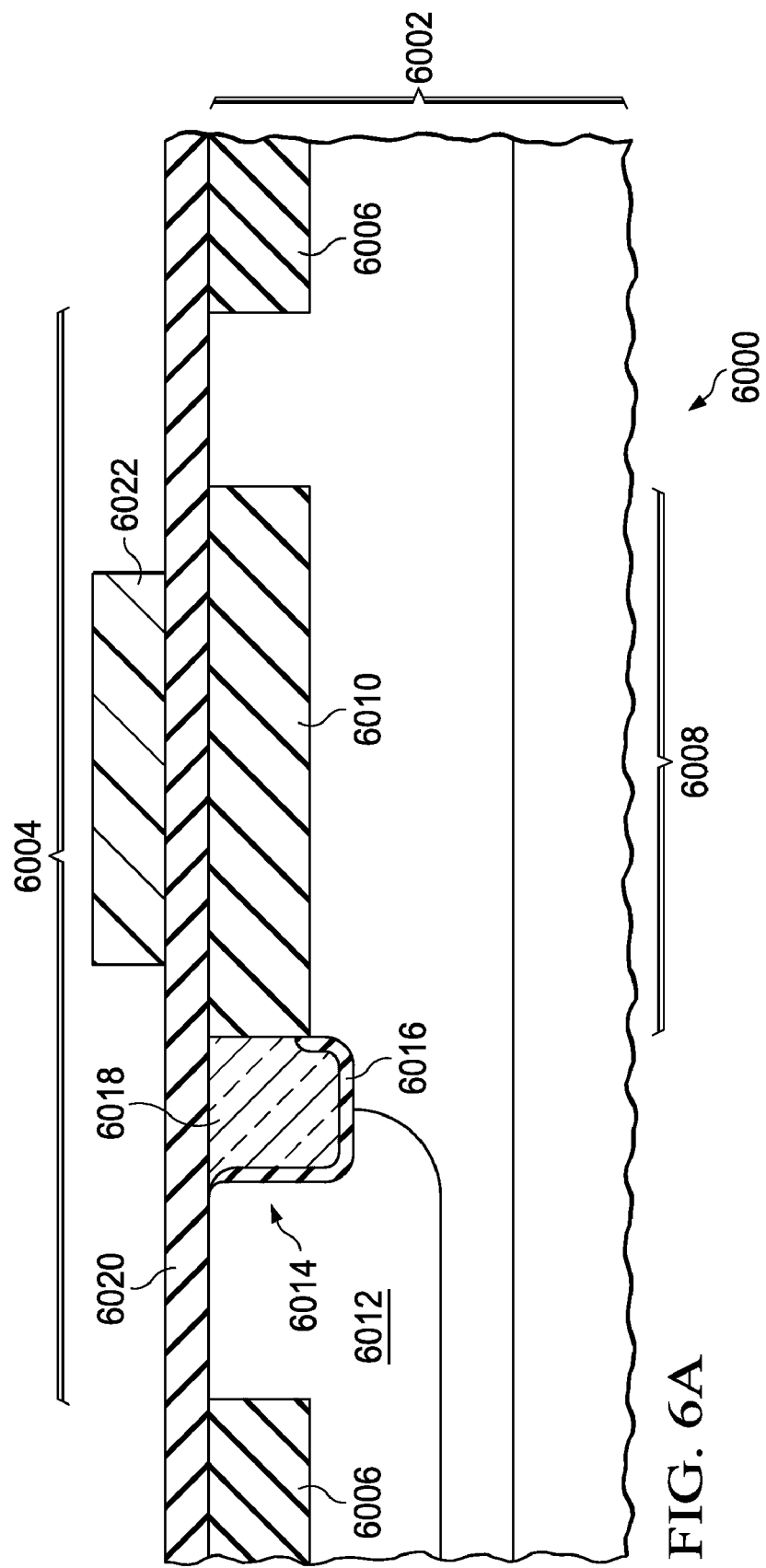

Referring to FIG. 6A, an integrated circuit (6000) is formed in and on a substrate (6002) as described in reference to FIG. 1A. The integrated circuit (6000) contains an area for a transistor (6004) formed according to an embodiment of the instant invention. Optional elements of field oxide (6006) may be formed at a top surface of the substrate (6002) to isolate the transistor (6004) from other components in the integrated circuit (6000) as described in reference to FIG. 1A. A drift region (6008) is formed in the transistor (6004) and an isolation dielectric layer (6010) is formed at the top surface of the substrate (6002) over the drift region (6008) as described in reference to FIG. 1A. A body well (6012) is formed in the transistor (6004) as described in reference to FIG. 1A. A gate trench (6014) is formed in the transistor (6004) in the substrate (6002) abutting, and possibly overlapping, the isolation dielectric layer (6010) as described in reference to FIG. 1A and FIG. 1B. A gate dielectric layer (6016) is formed on exposed surfaces of the gate trench (6014) as described in reference to FIG. 1C. A gate (6018) is formed in the gate trench (6014) on the gate dielectric layer (6016) as described in reference to FIG. 1D and FIG. 1E. In one realization of the instant embodiment, the gate (6018) is planarized so that a top surface of the gate (6018) is substantially coplanar with a top surface of the isolation dielectric layer (6010) as depicted in FIG. 6A.

A field plate layer (6020) is formed on an existing top surface of the integrated circuit (6000). The field plate layer (6020) may be one of various forms of silicon, a metallic material such as tungsten or titanium nitride, other conductive material, or a combination of these materials. A field plate photoresist pattern (6022) is formed on a top surface of the field plate layer (6020) to define the area for the field plate. In the instant embodiment, the area for the field plate does not abut or overlap the gate (6018).

Figure 6B:
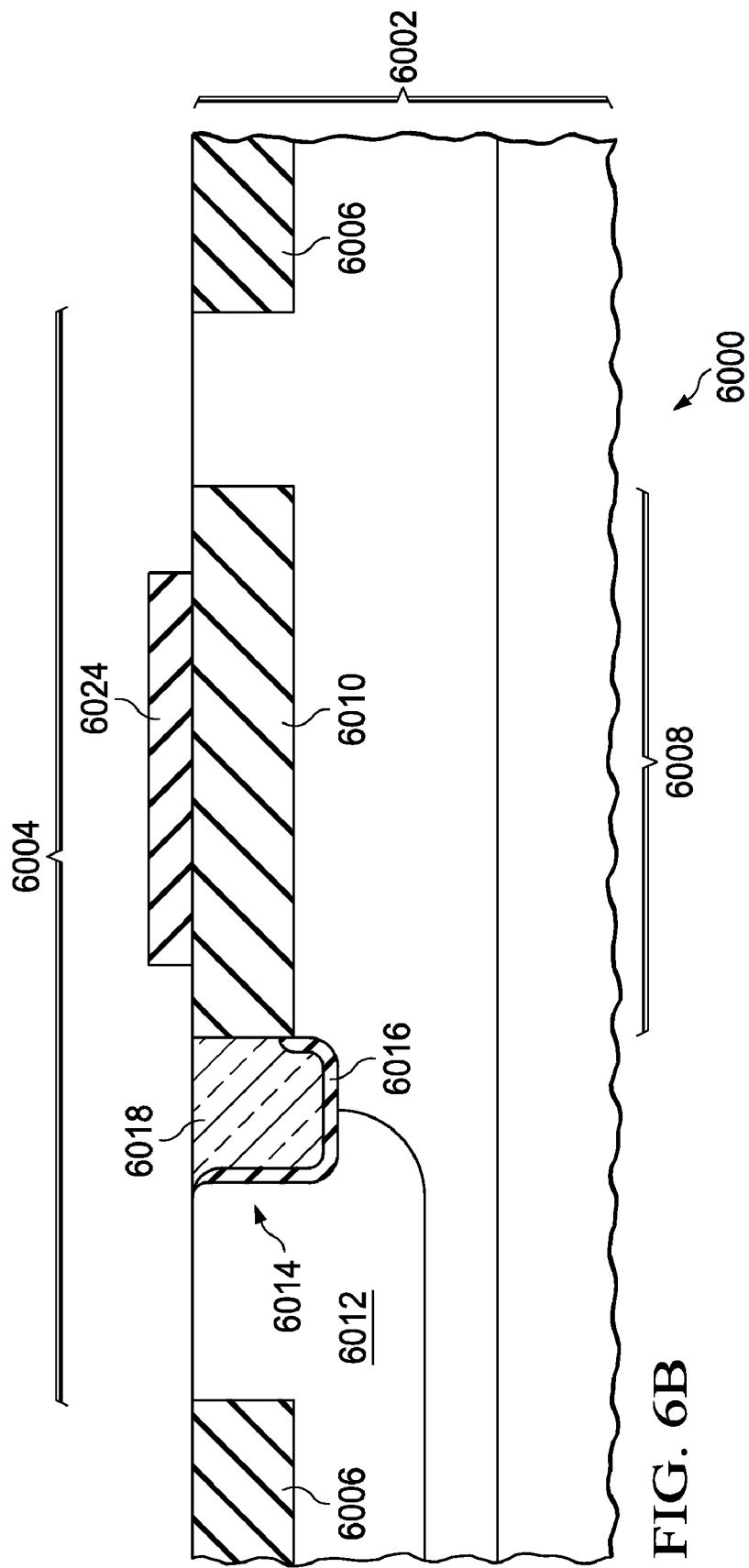

Referring to FIG. 6B, the field plate (6024) is formed by removing unwanted material from the field plate layer, for example by an RIE process. The field plate photoresist pattern is removed after the field plate is formed, for example by exposing the integrated circuit (6000) to an oxygen containing plasma, followed by a wet cleanup to remove any organic residue from the top surface of the integrated circuit (6000). Forming the field plate (6024) to be electrically separated from the gate (6018) enables the field plate (6024) to be biased separately from the gate (6018), which may advantageously increase a maximum drain voltage of the transistor (6004). Forming the field plate (6024) using a separate layer from the gate (6018) enables the field plate (6024) to be located closer to the gate (6018), which may allow reduction of an electric field in the drift region (6008) at an interface with the isolation dielectric layer (6010), which may advantageously increase a maximum drain voltage of the transistor (6004). In an alternate realization of the instant embodiment, the field plate (6024) may be formed prior to forming the gate (6018).

Transistors formed according to the instant invention may include more than one gate trench and/or more than one isolation dielectric layer. FIG. 7A through FIG. 7D, FIG. 8A through FIG. 8D, FIG. 9A through FIG. 9D, FIG. 10A through FIG. 10D, FIG. 11A through FIG. 11D, and FIG. 12A and FIG. 12B are top views of embodiments of configurations of gate trenches and isolation dielectric layers. Field oxide elements, body wells and field plates are not shown in FIG. 7A through FIG. 7D, FIG. 8A through FIG. 8D, FIG. 9A through FIG. 9D, FIG. 10A through FIG. 10D, FIG. 11A through FIG. 11D, and FIG. 12A and FIG. 12B for clarity.

Figure 7A:
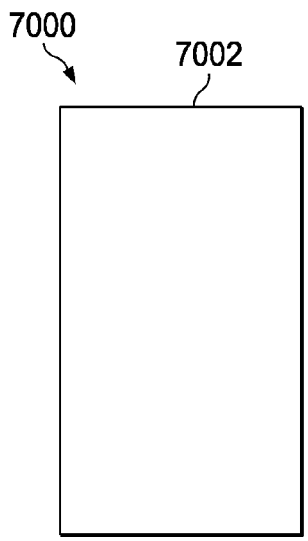
FIG. 7A through FIG. 7D, FIG. 8A through FIG. 8D, FIG. 9A through FIG. 9D, FIG. 10A through FIG. 10D, and FIG. 11A through FIG. 11D are top views of embodiments of configurations of gate trenches and isolation dielectric layers.
Figure 7B:
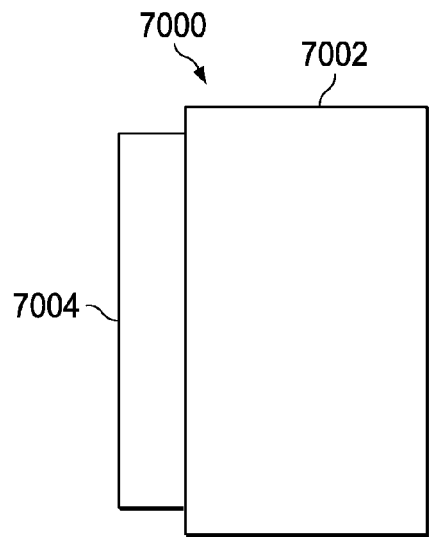
Figure 7C:
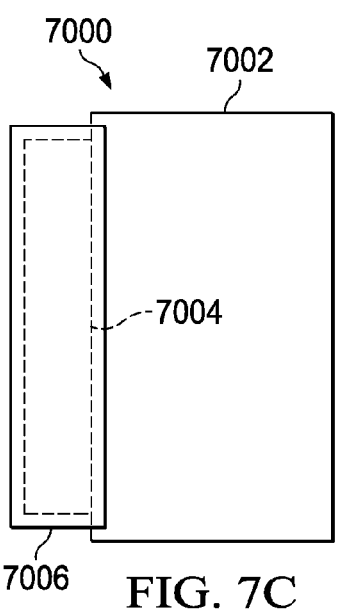
Figure 7D:
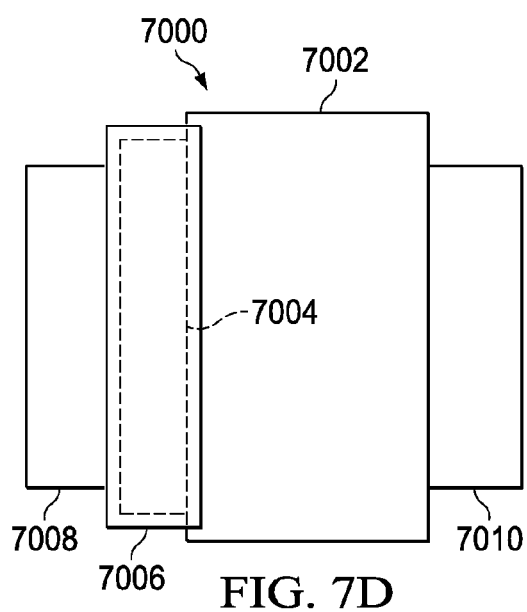

FIG. 7A through FIG. 7D are top views of a transistor (7000) formed according to an embodiment containing one gate trench and one isolation dielectric layer, formed according to the instant invention, depicted in successive stages of fabrication. Referring to FIG. 7A, a single isolation dielectric layer (7002) is formed in an integrated circuit (not shown). Referring to FIG. 7B, a single gate trench (7004) is formed abutting and possibly overlapping the isolation dielectric layer (7002) as described in reference to FIG. 1A and FIG. 1B. A width of the gate trench (7004) may be less than a width of the isolation dielectric layer (7002) as depicted in FIG. 7B, or may be wider in other embodiments. Referring to FIG. 7C, a gate (7006) is formed in the gate trench (7004) as described in reference to FIG. 1D and FIG. 1E. Referring to FIG. 7D, a source diffused region (7008) is formed adjacent to the gate trench (7004) as described in reference to FIG. 1F through FIG. 1H. A drain diffused region (7010) is formed adjacent to the isolation dielectric layer (7002) opposite the gate trench (7004) as described in reference to FIG. 1F through FIG. 1H. Forming the transistor (7000) in the configuration depicted in FIG. 7D may enable the advantages described in reference to FIG. 1H.

Figure 8A:
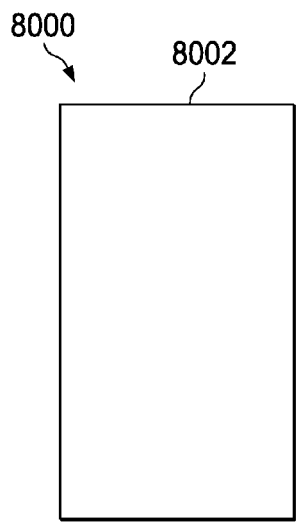
Figure 8B:
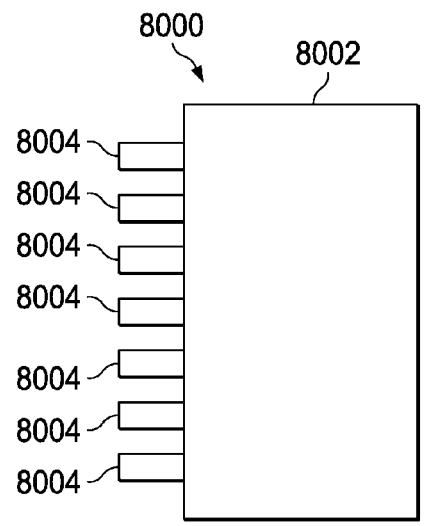
Figure 8C:
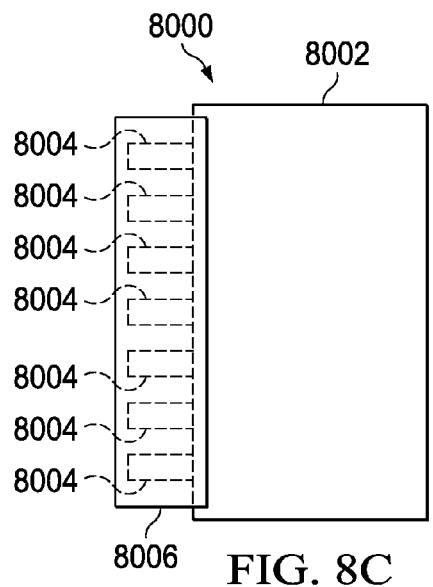
Figure 8D:
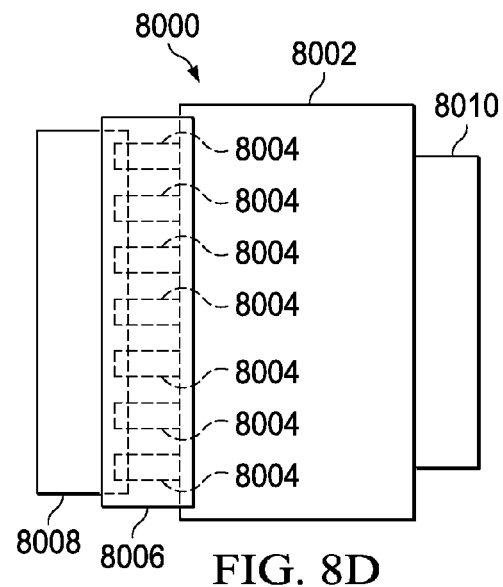

FIG. 8A through FIG. 8D are top views of a transistor (8000) formed according to an embodiment containing multiple gate trenches configured in parallel and one isolation dielectric layer, formed according to the instant invention, depicted in successive stages of fabrication. Referring to FIG. 8A, a single isolation dielectric layer (8002) is formed in an integrated circuit (not shown). Referring to FIG. 8B, multiple gate trenches (8004) are formed abutting and possibly overlapping the isolation dielectric layer (8002) as described in reference to FIG. 1A and FIG. 1B. A total width of the gate trenches (8004) may be less than a width of the isolation dielectric layer (8002) as depicted in FIG. 8B, or may be wider in other embodiments. Referring to FIG. 8C, a gate (8006) is formed in the gate trenches (8004) as described in reference to FIG. 1D and FIG. 1E. Referring to FIG. 8D, a source diffused region (8008) is formed adjacent to the gate trenches (8004) as described in reference to FIG. 1F through FIG. 1H. A drain diffused region (8010) is formed adjacent to the isolation dielectric layer (8002) opposite the gate trenches (8004) as described in reference to FIG. 1F through FIG. 1H. Forming multiple gate trenches (8004) in the transistor (8000) as depicted in FIG. 8D may provide an increased effective width of an inversion channel due to formation of inversion layers adjacent to lateral surfaces of the gate trenches (8004), which may advantageously provide an increased on-state current in the transistor (8000).

Figure 9A:
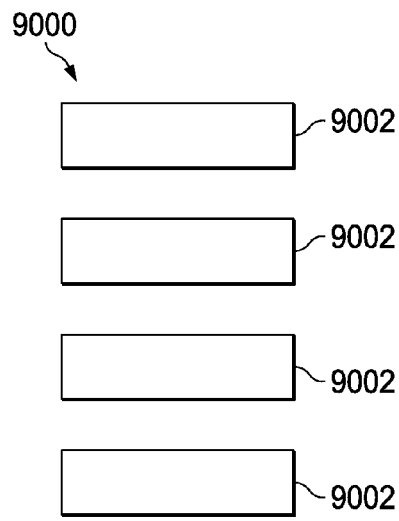
Figure 9B:
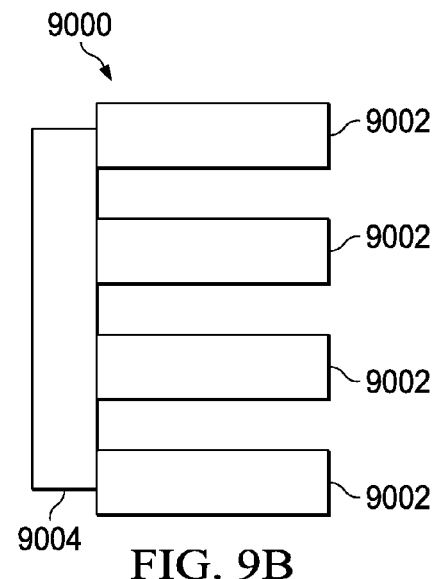
Figure 9C:
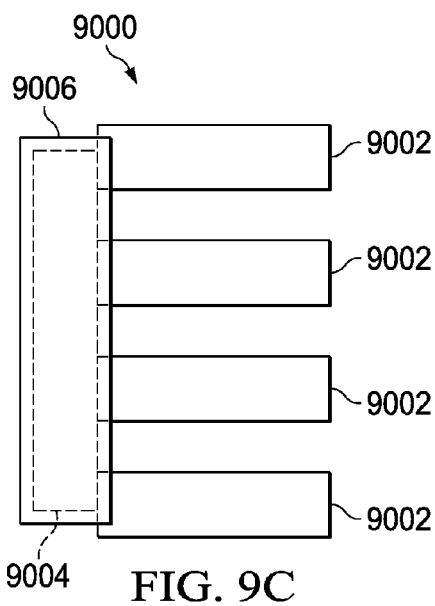
Figure 9D:
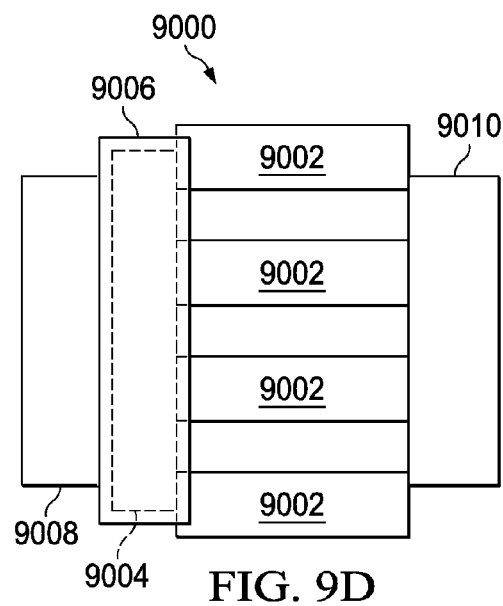

FIG. 9A through FIG. 9D are top views of a transistor (9000) formed according to an embodiment containing a single gate trench and multiple isolation dielectric layers configured in parallel, formed according to the instant invention, depicted in successive stages of fabrication. Referring to FIG. 9A, multiple isolation dielectric layers (9002) are formed in an integrated circuit (not shown). A drift region of the transistor (9000) may extend to regions between the isolation dielectric layers (9002). Referring to FIG. 9B, a single gate trench (9004) is formed abutting and possibly overlapping the isolation dielectric layers (9002) as described in reference to FIG. 1A and FIG. 1B. A width of the gate trench (9004) may be less than a total width of the isolation dielectric layers (9002) as depicted in FIG. 9B, or may be wider in other embodiments. Referring to FIG. 9C, a gate (9006) is formed in the gate trench (9004) as described in reference to FIG. 1D and FIG. 1E. Referring to FIG. 9D, a source diffused region (9008) is formed adjacent to the gate trench (9004) as described in reference to FIG. 1F through FIG. 1H. A drain diffused region (9010) is formed adjacent to the isolation dielectric layers (9002) opposite the gate trench (9004) as described in reference to FIG. 1F through FIG. 1H. Forming the transistor (9000) in the configuration depicted in FIG. 9D may provide a reduced series resistance of the drift region due to additional drift area in regions between the isolation dielectric layers (9002), which may advantageously provide an increased on-state current in the transistor (9000).

Figure 10A:
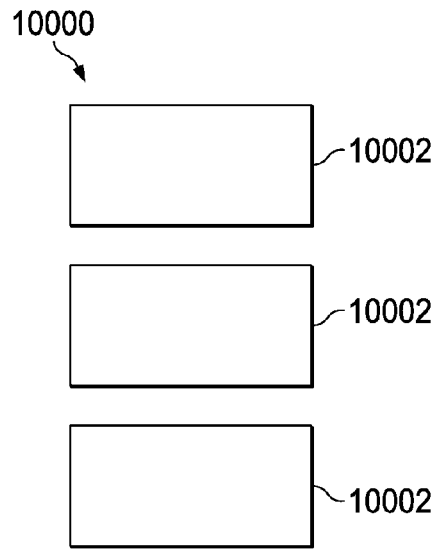
Figure 10B:
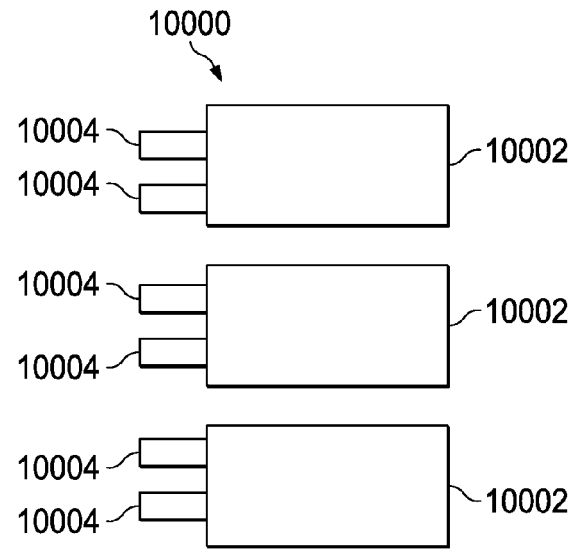

FIG. 10A through FIG. 10D are top views of a transistor (10000) formed according to an embodiment containing multiple gate trenches and multiple isolation dielectric layers, both configured in parallel, formed according to the instant invention, depicted in successive stages of fabrication. Referring to FIG. 10A, multiple isolation dielectric layers (10002) are formed in an integrated circuit (not shown). A drift region of the transistor (10000) may extend to regions between the isolation dielectric layers (10002). Referring to FIG. 10B, multiple gate trenches (10004) are formed abutting and possibly overlapping the isolation dielectric layers (10002) as described in reference to FIG. 1A and FIG. 1B. A total width of the gate trenches (10004) may be less than a total width of the isolation dielectric layers (10002) as depicted in FIG.

Figure 10C:
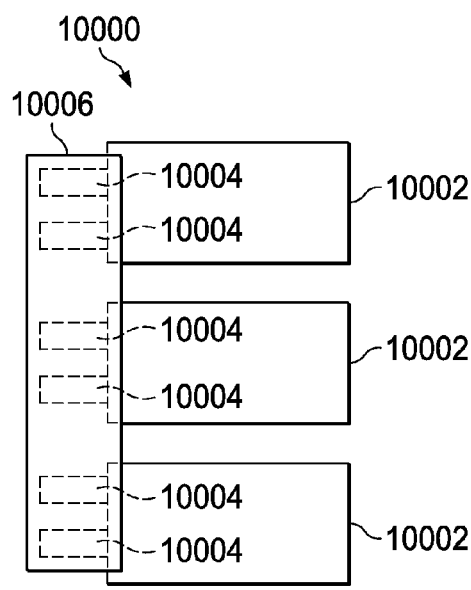
Figure 10D:
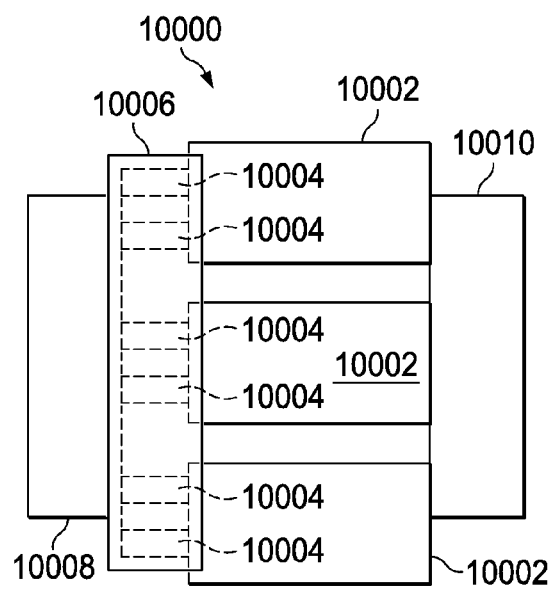

10B, or may be wider in other embodiments. Referring to FIG. 10C, a gate (10006) is formed in the gate trenches (10004) as described in reference to FIG. 1D and FIG. 1E. Referring to FIG. 10D, a source diffused region (10008) is formed adjacent to the gate trenches (10004) as described in reference to FIG. 1F through FIG. 1H. A drain diffused region (10010) is formed adjacent to the isolation dielectric layers (10002) opposite the gate trench (10004) as described in reference to FIG. 1F through FIG. 1H. Forming multiple gate trenches (10004) in the transistor (10000) as depicted in FIG. 10C may provide an increased effective width of an inversion channel due to formation of inversion layers adjacent to lateral surfaces of the gate trenches (10004), which may advantageously provide an increased on-state current in the transistor (10000). Additionally, forming the transistor (10000) in the configuration depicted in FIG. 10D may provide a reduced series resistance of the drift region due to additional drift area in regions between the isolation dielectric layers (10002), which may also advantageously provide a further increase of on-state current in the transistor (10000).

Figure 11A:
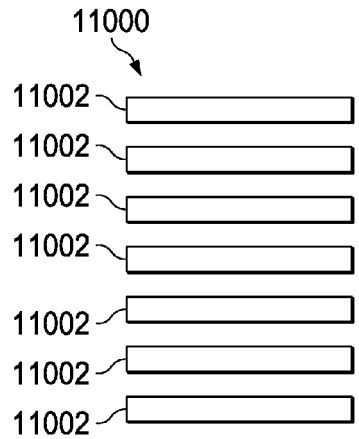
Figure 11B:
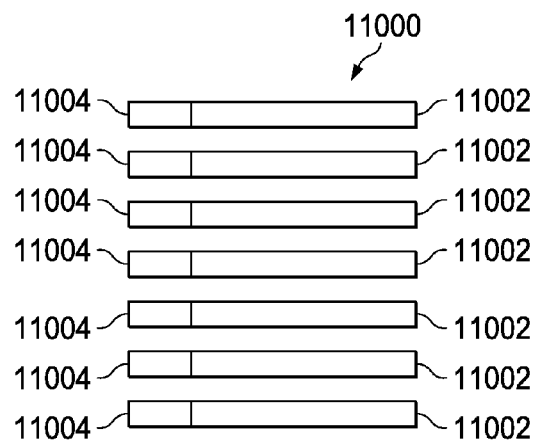
Figure 11C:
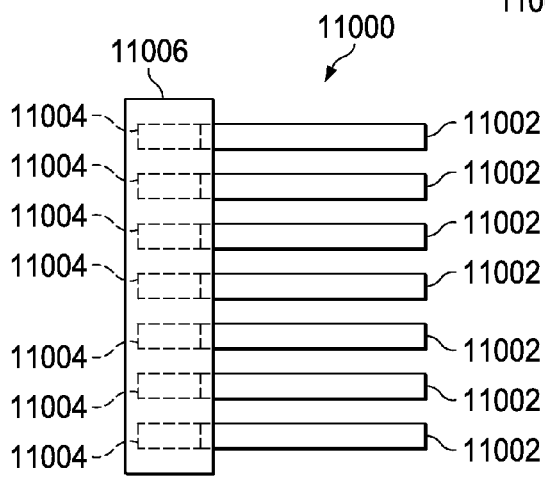
Figure 11D:
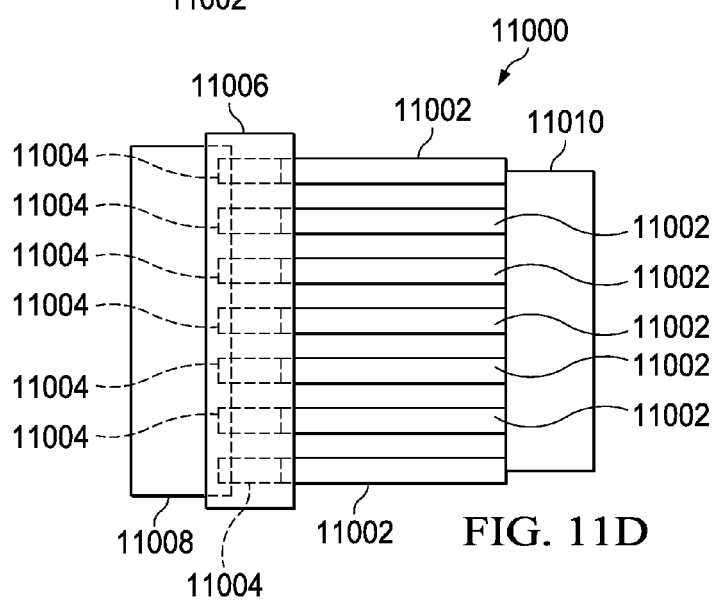

FIG. 11A through FIG. 11D are top views of a transistor (11000) formed according to an embodiment containing multiple gate trenches and multiple isolation dielectric layers, both configured in parallel, in which each gate trench is aligned with an isolation dielectric layer, formed according to the instant invention, depicted in successive stages of fabrication. Referring to FIG. 11A, multiple isolation dielectric layers (11002) are formed in an integrated circuit (not shown). A drift region of the transistor (11000) may extend to regions between the isolation dielectric layers (11002). Referring to FIG. 11B, multiple gate trenches (11004) are formed abutting and possibly overlapping the isolation dielectric layers (11002) as described in reference to FIG. 1A and FIG. 1B, so that each gate trench (11004) is aligned with a isolation dielectric layer (11002). In one embodiment, a width of each gate trench (11004) may be substantially equal to a width of each corresponding isolation dielectric layer (11002) as depicted in FIG. 11B. In another embodiment, a width of each gate trench (11004) may be greater than a width of each corresponding isolation dielectric layer (11002). In yet another embodiment, a width of each gate trench (11004) may be less than a width of each corresponding isolation dielectric layer (11002). Referring to FIG. 11C, a gate (11006) is formed in the gate trenches (11004) as described in reference to FIG. 1D and FIG. 1E. Referring to FIG. 11D, a source diffused region (11008) is formed adjacent to the gate trenches (11004) as described in reference to FIG. 1F through FIG. 1H. A drain diffused region (11010) is formed adjacent to the isolation dielectric layers (11002) opposite the gate trench (11004) as described in reference to FIG. 1F through FIG. 1H. Forming multiple gate trenches (11004) aligned with isolation dielectric layers (11002) in the transistor (11000) as depicted in FIG. 11D may provide an increased effective width of an inversion channel due to formation of inversion layers adjacent to lateral surfaces of the gate trenches (11004) which is efficiently coupled to the drift region, which may advantageously provide an increased on-state current in the transistor (11000) compared to other embodiments.

Figure 12A:
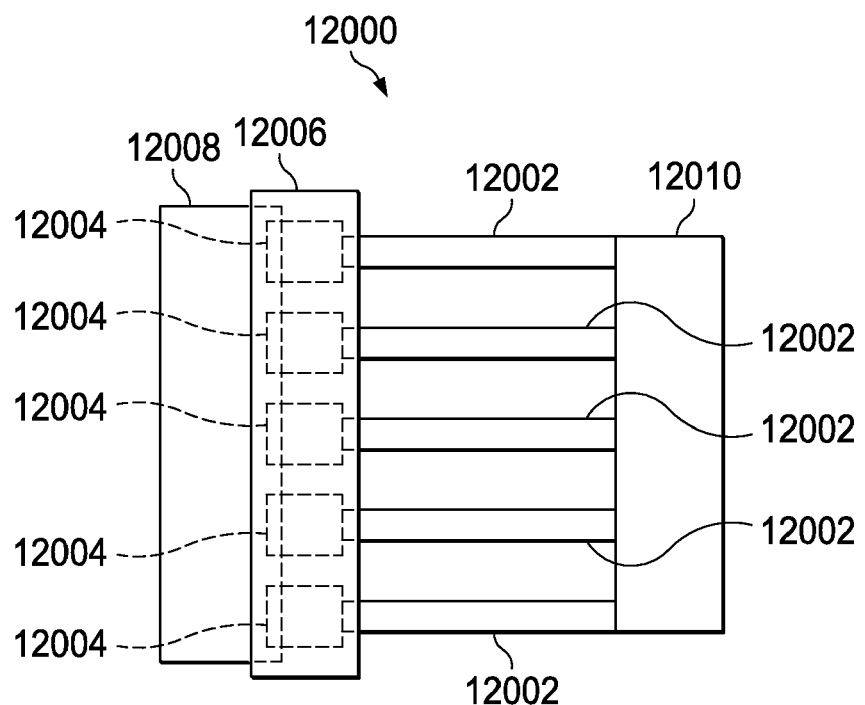
FIG. 12A and FIG. 12B are top views of two realizations of the embodiment discussed in reference to FIG. 11A through FIG. 11D.
Figure 12B:
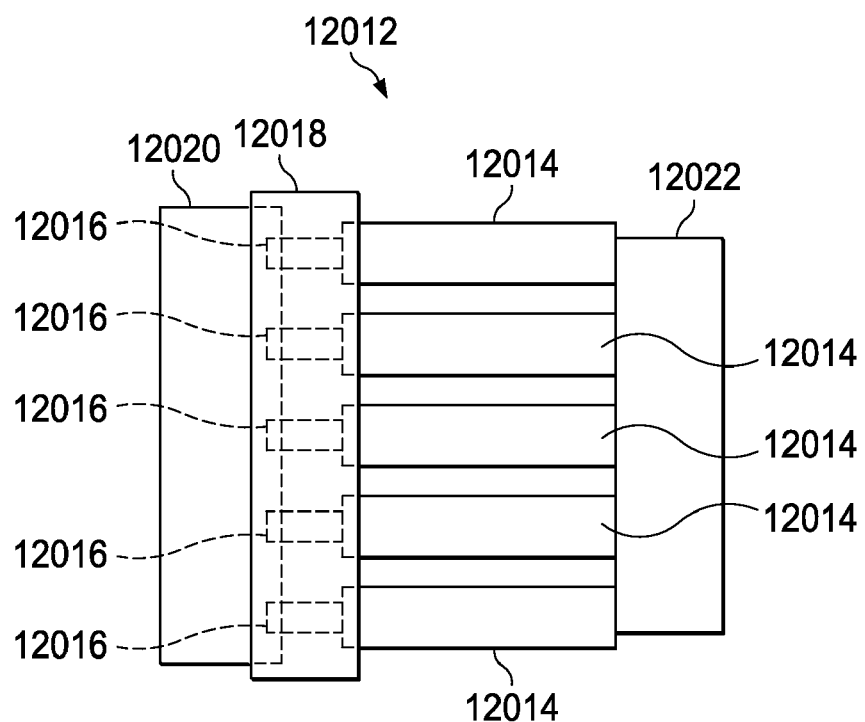

FIG. 12A and FIG. 12B are top views of two realizations of the embodiment discussed in reference to FIG. 11A through FIG. 11D. Referring to FIG. 12A, a first transistor (12000) includes multiple first isolation dielectric layers (12002) formed in a first integrated circuit (not shown). Multiple first gate trenches (11004) are formed abutting and possibly overlapping the first isolation dielectric layers (11002). In the instant realization, each first gate trench (11004) is wider than a corresponding isolation dielectric layer (12002). A first gate (12006) is formed in the trenches (12004). A first source diffused region (12008) is formed adjacent to the gate trenches (12004) and a first drain diffused region (12010) is formed adjacent to the isolation dielectric layers (12002) opposite the gate trenches (12004). Forming multiple gate trenches (12004) wider than isolation dielectric layers (12002) in the transistor (12000) as depicted in FIG. 12A may provide an efficient coupling of channel current to a drift region under and between the isolation dielectric layers (12002), which may advantageously provide an increased on-state current in the transistor (12000) compared to other embodiments.

Referring to FIG. 12B, a second transistor (12012) includes multiple second isolation dielectric layers (12014) formed in a second integrated circuit (not shown). Multiple second gate trenches (11016) are formed abutting and possibly overlapping the second isolation dielectric layers (11014). In the instant realization, each second gate trench (11016) is narrower than a corresponding isolation dielectric layer (12014). A second gate (12018) is formed in the trenches (12016). A second source diffused region (12020) is formed adjacent to the gate trenches (12016) and a second drain diffused region (12022) is formed adjacent to the isolation dielectric layers (12014) opposite the gate trenches (12016). Forming multiple gate trenches (12004) narrower than isolation dielectric layers (12002) in the transistor (12000) as depicted in FIG. 12A may provide an increased effective channel width for a size of the transistor (12000), which may advantageously provide an increased on-state current in the transistor (12000) compared to other embodiments of a substantially equal size.

Figure 13:
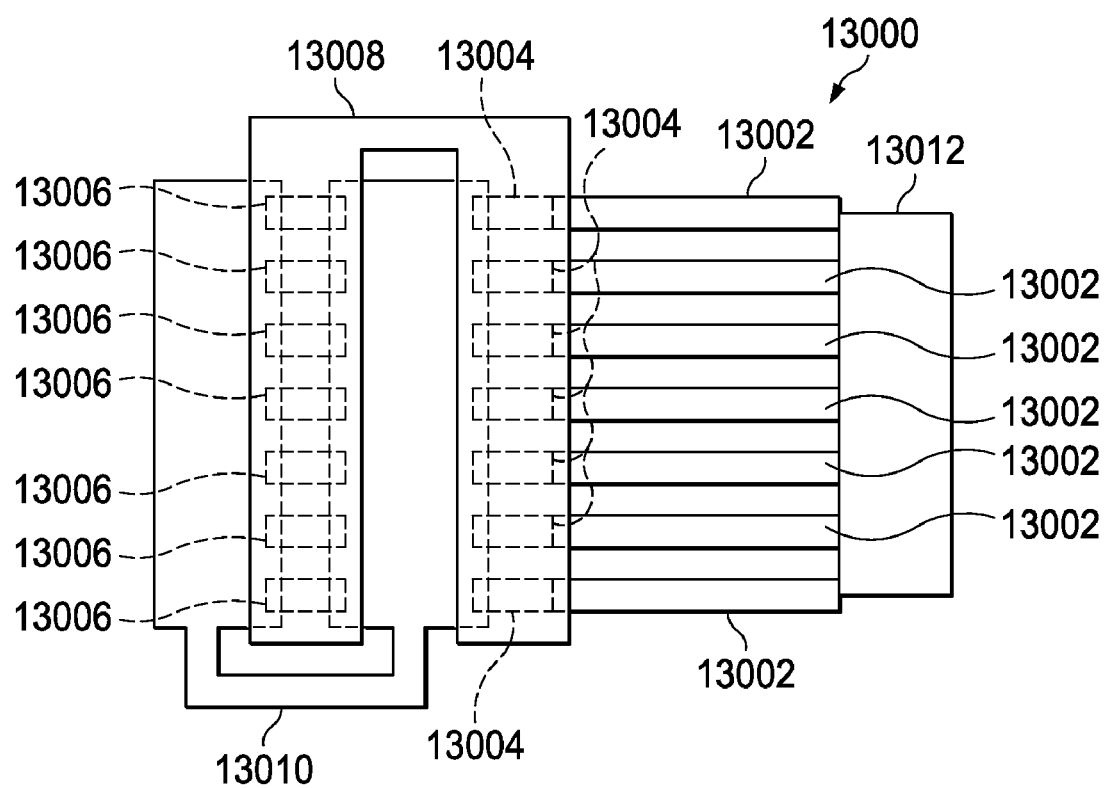
FIG. 13 is a top view of a realization of the embodiment discussed in reference to FIG. 2G.

FIG. 13 is a top view of a realization of the embodiment discussed in reference to FIG. 2G. A transistor (13000) includes multiple isolation dielectric layers (13002) formed in an integrated circuit (not shown). A buried layer (not shown) is formed in a substrate of the integrated circuit under the transistor (13000) as described in reference to FIG. 2G. A set of first gate trenches (13004) is formed abutting and possibly overlapping the isolation dielectric layers (13002). In the instant realization, each instance of the first gate trenches (13004) is aligned with a corresponding instance of the isolation dielectric layers (13002). A set of second gate trenches (13006) is formed proximate to the first gate trenches (13004) opposite the isolation dielectric layers (13002). In the instant realization, each instance of the second gate trenches (13006) is aligned with a corresponding instance of the first gate trenches (13004). In alternate realizations, the second gate trenches (13006) may not be aligned with the first gate trenches (13004). A gate (13008) is formed in the first gate trenches (13004) and the second gate trenches (13006). A source diffused region (13010) is formed adjacent to the first gate trenches (13004) and the second gate trenches (13006). The source diffused region (13010) may optionally be located on both sides of the second gate trenches (13006) as depicted in FIG. 13. A drain diffused region (13012) is formed adjacent to the isolation dielectric layers (13002) opposite the first gate trenches (13004).

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit containing an MOS transistor, said integrated circuit comprising:
 a semiconductor substrate;
 a drift region formed in said substrate, said drift region having a first conductivity type, such that said drift region extends to a top surface of said substrate;
 an isolation dielectric layer formed at said top surface of said substrate over said drift region;
 a gate trench formed in said substrate, such that said gate trench abuts said isolation dielectric layer;
 a body well formed in said substrate adjacent to said drift region, such that said body well overlaps a first portion of a bottom surface of said gate trench, and such that said body well has an opposite conductivity type from said drift region;
 a gate dielectric layer formed on exposed surfaces of said substrate in said gate trench;
 a gate formed on said gate dielectric layer in said gate trench; and
 a source diffused region formed in said body well, such that said source diffused region abuts said gate dielectric layer in said gate trench and overlaps a second portion of said bottom surface of said gate trench, said second portion of said bottom surface of said gate trench being within said first portion of said bottom surface of said gate trench, and such that said source diffused region has a same conductivity type as said drift region.

2. The integrated circuit of claim 1, further including:
 a second isolation dielectric layer formed at said top surface of said substrate over said drift region, such that said second isolation dielectric layer is separate from said first isolation dielectric layer; and
 a second gate trench formed in said substrate such that:
  said second gate trench is separate from said first gate trench;
  said second gate trench abuts said second isolation dielectric layer;
  said body well overlaps a first portion of a bottom surface of said second gate trench;
  said gate dielectric layer is formed on exposed surfaces of said substrate in said second gate trench;
  said gate is formed on said gate dielectric layer in said second gate trench; and
  said source diffused region abuts said gate dielectric layer in said second gate trench and overlaps a second portion of said bottom surface of said second gate trench, said second portion of said bottom surface of said second gate trench being within said first portion of said bottom surface of said second gate trench.

3. The integrated circuit of claim 2, in which said gate overlaps said substrate between said first gate trench and said second gate trench.

4. The integrated circuit of claim 1, in which a lateral distance from a boundary of said source diffused region to a boundary of said body well is substantially constant on lateral surfaces and said bottom surface of said gate trench.

5. The integrated circuit of claim 1, in which a depth of said gate trench is less than a depth of said isolation dielectric layer.

6. The integrated circuit of claim 1, further including a field plate formed on a top surface of said isolation dielectric layer.

* * * * *